(12) United States Patent
Sharp et al.

(10) Patent No.: US 8,228,062 B2
(45) Date of Patent: Jul. 24, 2012

(54) RF BASED SPATIALLY SELECTIVE EXCITATION IN MRI

(76) Inventors: Jonathan Sharp, Calgary (CA); Scott King, Winnipeg (CA)

( * ) Notice: Subject to any disclaimer, the term of this patent is extended or adjusted under 35 U.S.C. 154(b) by 279 days.

(21) Appl. No.: 12/449,835

(22) PCT Filed: May 2, 2008

(86) PCT No.: PCT/CA2008/000866
§ 371 (c)(1),
(2), (4) Date: Jan. 22, 2010

(87) PCT Pub. No.: WO2008/134891
PCT Pub. Date: Nov. 13, 2008

(65) Prior Publication Data
US 2010/0171499 A1 Jul. 8, 2010

Related U.S. Application Data

(60) Provisional application No. 60/924,195, filed on May 3, 2007, provisional application No. 61/071,269, filed on Apr. 18, 2008.

(51) Int. Cl.
*G01V 3/00* (2006.01)
(52) U.S. Cl. ........................................................ 324/309
(58) Field of Classification Search .......... 324/300–322; 600/407–445
See application file for complete search history.

(56) References Cited

U.S. PATENT DOCUMENTS

| 6,031,375 A | 2/2000 | Atalar et al. |
| 7,141,971 B2 | 11/2006 | Duensing et al. |
| 7,141,973 B2 * | 11/2006 | King et al. ..................... 324/314 |
| 7,603,157 B2 * | 10/2009 | Feiweier et al. .............. 600/410 |
| 7,683,618 B2 * | 3/2010 | Balchandani et al. ........ 324/309 |
| 2005/0099178 A1 * | 5/2005 | King et al. ..................... 324/309 |
| 2010/0253344 A1 * | 10/2010 | Fautz ............................. 324/309 |

FOREIGN PATENT DOCUMENTS

| EP | 1852710 | 7/2007 |
| WO | 2005012931 | 2/2005 |

OTHER PUBLICATIONS

Duensing et al., "N-Dimensional Orthogonality of Volume Coil Arrays", Proc. Intl. Soc. Mag. Reson. Med., 2002, 10.
King et al., "Transmit Array Spatial Encoding (Trase): A New Data Acquisition Method in MRI", Proc. Intl. Soc. Mag. Reson. Med., 2006, 14, p. 2826.
King et al., "Phase encoding without gradients using TRASE-FSE MRI", Proc. Intl. Soc. Mag. Reson. Med., 2007, 15, p. 680.

* cited by examiner

*Primary Examiner* — Brij Shrivastav
(74) *Attorney, Agent, or Firm* — Jason E. J. Davis

(57) ABSTRACT

Herein a method for slice selection is provided in an MRI process, the method involves controlling a transmit array by adding low flip angle RF pulses interspersed between refocusing pulses that are used to move a k-space weighting function with respect to one or more B 1 fields used to deposit energy according to a desired k-space weighting function. The low flip angle pulses deposit energy so that an envelope traced by the low flip angle pulses in the k-space weighting function is related to a desired spatially excited region of the sample volume, for example by a Fourier transform, if the phase encoding directions are linear axes that coordinatize the sample volume, and the B 1 fields have linear phase gradients.

24 Claims, 31 Drawing Sheets

A

B

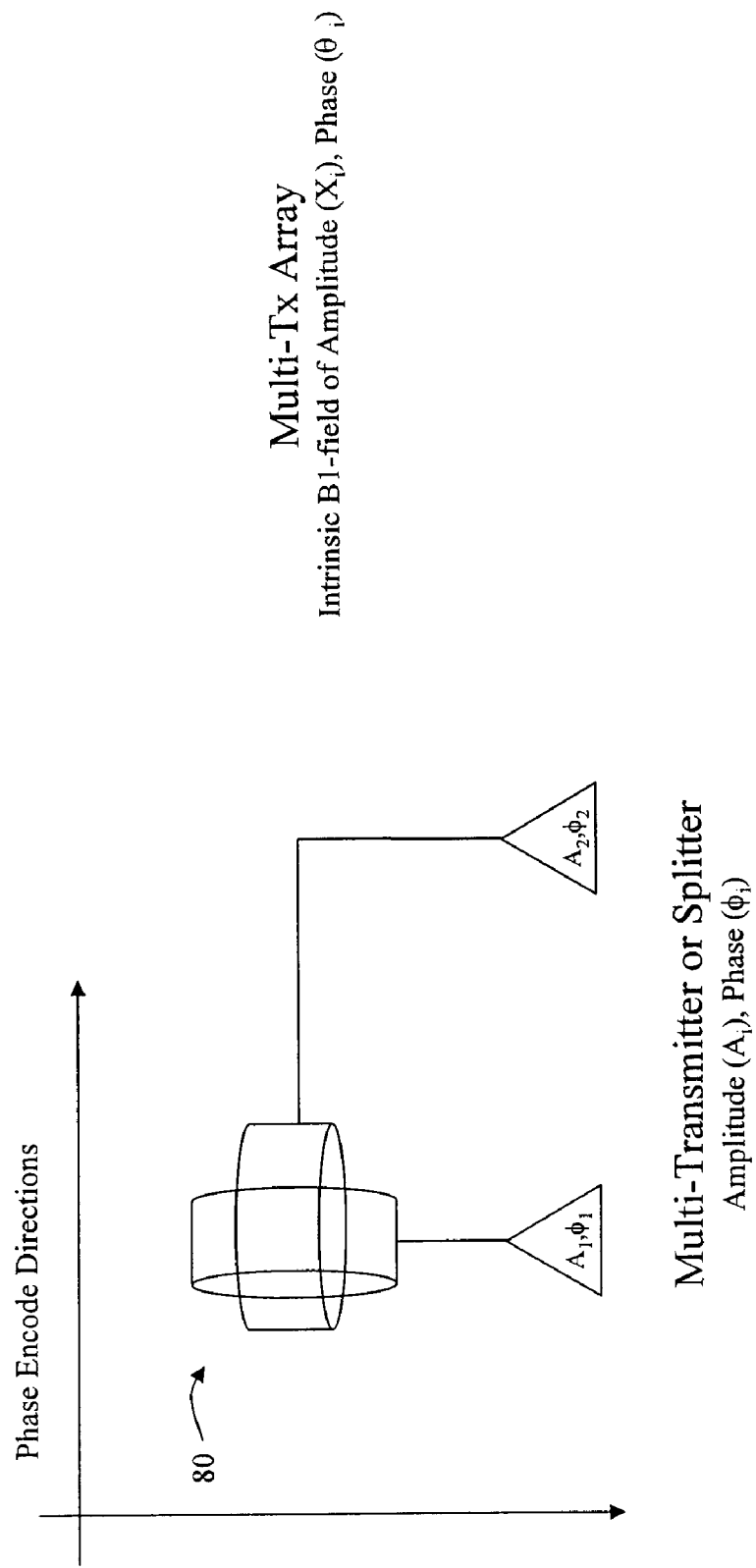

A: Helmholtz(co-rotating current) pair  +  B: Maxwell (counter-rotating current) pair  =  $+3/4\pi$ A: Helmholtz(co-rotating current) pair  +  B: Maxwell (counter-rotating current) pair  =  $-3/4\pi$ x-direction phase encoding

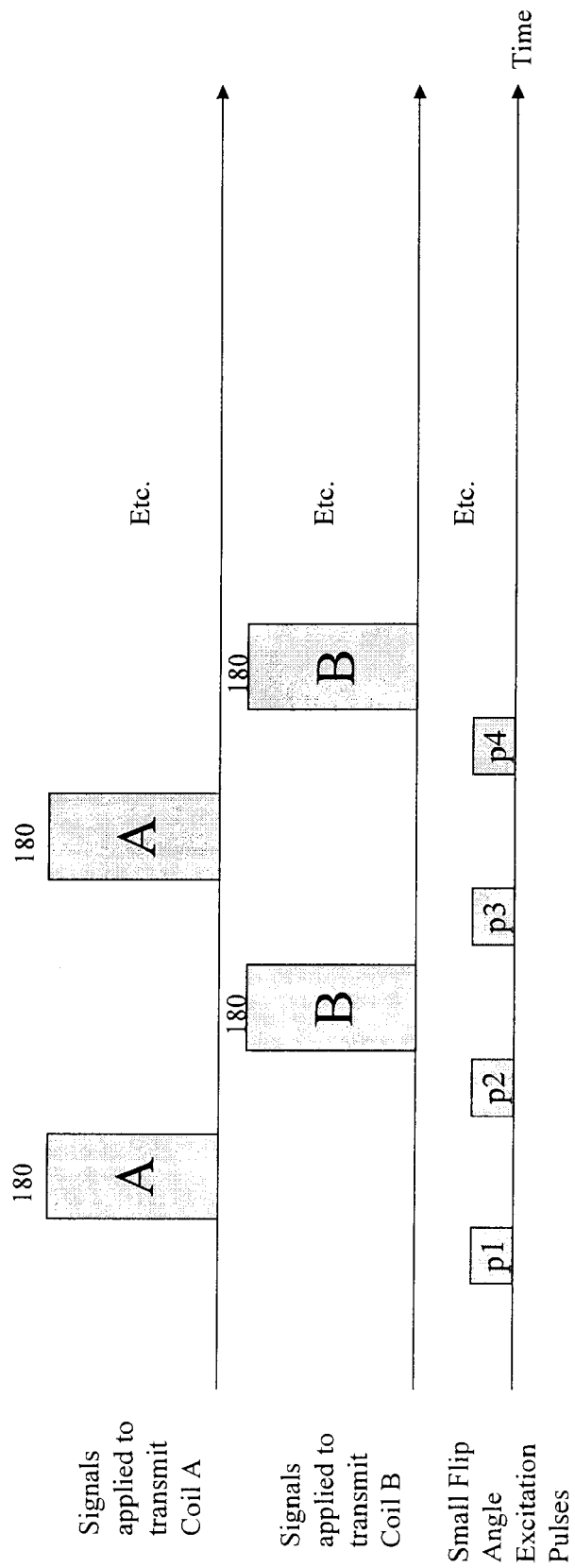

FIG. 5c

| Pulse # | Pulse | Flip Angle | Soft Pulse Waveform Phase | PHASE AB Alternation Phase | Final Phase | Phase Gradient (deg/mm) |
|---|---|---|---|---|---|---|
| 1 | 10 | 0.19 | 180 | | 180 | 0 |
| 2 | 3 | 180 | 0 | 180 | 0 | -1 |
| 3 | 10 | 0.7 | 180 | 0 | 180 | 0 |
| 4 | 4 | 180 | 0 | 180 | 0 | -1 |
| 5 | 10 | 1.18 | 180 | 0 | 180 | 0 |
| 6 | 3 | 180 | 0 | 180 | 0 | -1 |
| 7 | 10 | 1.53 | 180 | 0 | 180 | 0 |
| 8 | 4 | 180 | 0 | 180 | 0 | -1 |
| 9 | 10 | 1.69 | 180 | 0 | 180 | 0 |
| 10 | 3 | 180 | 0 | 180 | 0 | -1 |
| 11 | 10 | 1.58 | 180 | 0 | 180 | 0 |
| 12 | 4 | 180 | 0 | 180 | 0 | -1 |
| 13 | 10 | 1.18 | 180 | 0 | 180 | 0 |
| 14 | 3 | 180 | 0 | 180 | 0 | -1 |
| 15 | 10 | 0.48 | 180 | 0 | 180 | 0 |
| 16 | 4 | 180 | 0 | 180 | 0 | -1 |
| 17 | 10 | 0.49 | 180 | 0 | 180 | 0 |
| 18 | 3 | 180 | 0 | 180 | 0 | -1 |
| 19 | 10 | 1.69 | 180 | 0 | 180 | 0 |
| 20 | 4 | 180 | 0 | 180 | 0 | -1 |
| 21 | 10 | 3.01 | 180 | 0 | 180 | 0 |
| 22 | 3 | 180 | 0 | 180 | 0 | -1 |
| 23 | 10 | 4.35 | 180 | 0 | 180 | 0 |
| 24 | 4 | 180 | 0 | 180 | 0 | -1 |
| 25 | 10 | 5.6 | 180 | 0 | 180 | 0 |
| 26 | 3 | 180 | 0 | 180 | 0 | -1 |
| 27 | 10 | 6.64 | 180 | 0 | 180 | 0 |
| 28 | 4 | 180 | 0 | 180 | 0 | -1 |
| 29 | 10 | 7.39 | 180 | 0 | 180 | 0 |
| 30 | 3 | 180 | 0 | 180 | 0 | -1 |
| 31 | 10 | 7.77 | 180 | 0 | 180 | 0 |
| 32 | 4 | 180 | 0 | 180 | 0 | -1 |
| 33 | 10 | 7.74 | 180 | 0 | 180 | 0 |
| 34 | 3 | 180 | 0 | 180 | 0 | -1 |
| 35 | 10 | 7.32 | 180 | 0 | 180 | 0 |
| 36 | 4 | 180 | 0 | 180 | 0 | -1 |
| 37 | 10 | 6.53 | 180 | 0 | 180 | 0 |
| 38 | 3 | 180 | | | | -1 |
| 39 | 10 | 5.45 | | | 180 | 0 |
| 40 | 4 | 180 | | | 0 | -1 |
| 41 | 10 | 4.18 | | | 180 | 0 |
| 42 | 3 | 180 | | | 0 | -1 |
| 43 | 10 | 2.84 | | | 180 | 0 |
| 44 | 4 | 180 | | | 0 | -1 |
| 45 | 10 | 1.53 | | | 180 | 0 |
| 46 | 3 | 180 | | | 0 | -1 |
| 47 | 10 | 0.36 | | 180 | 180 | 0 |
| 48 | 4 | 180 | | 0 | 0 | -1 |
| 49 | 10 | 0.59 | | 180 | 180 | 0 |
| 50 | 3 | 180 | | 0 | 0 | -1 |
| 51 | 10 | 1.25 | | 180 | 180 | 0 |
| 52 | 4 | 180 | | 0 | 0 | -1 |
| 53 | 10 | 1.61 | | 180 | 180 | 0 |
| 54 | 3 | 180 | | 0 | 0 | -1 |
| 55 | 10 | 1.68 | | 180 | 180 | 0 |
| 56 | 4 | 180 | | 0 | 0 | -1 |
| 57 | 10 | 1.5 | | 180 | 180 | 0 |
| 58 | 3 | 180 | | 0 | 0 | -1 |
| 59 | 10 | 180 | | | | -1 |
| 60 | 4 | 180 | | | | -1 |
| 61 | 3 | 180 | | | | -1 |
| 62 | 4 | 180 | | | | -1 |
| 63 | 3 | 180 | | | | -1 |
| 64 | 4 | 180 | | | | -1 |
| 65 | 3 | 180 | | | | -1 |
| 66 | 4 | 180 | | | | -1 |
| 67 | 3 | 180 | | | | -1 |
| 68 | 4 | 180 | | | | -1 |
| 69 | 3 | 180 | | | | -1 |
| 70 | 4 | 180 | | | | -1 |
| 71 | 3 | 180 | | | | -1 |

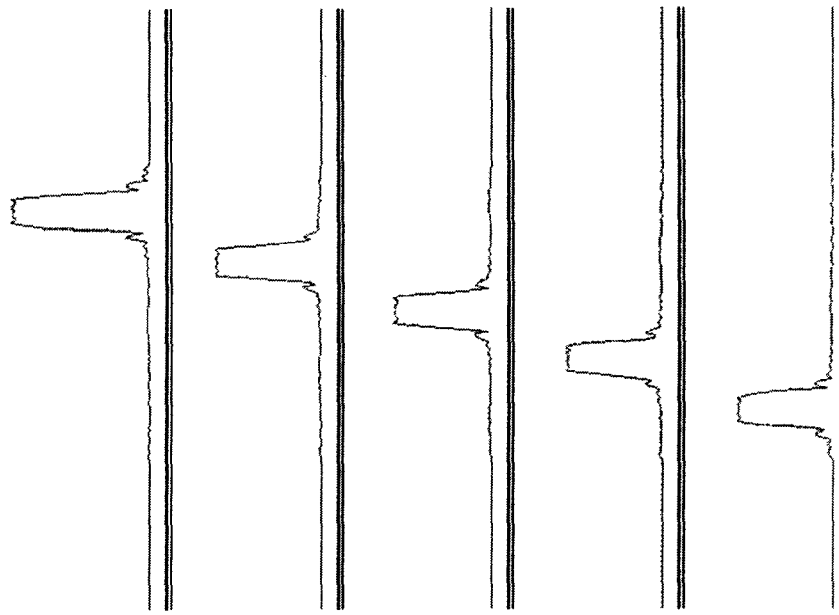
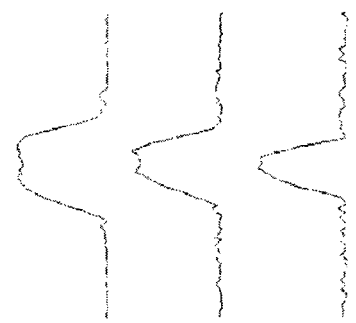
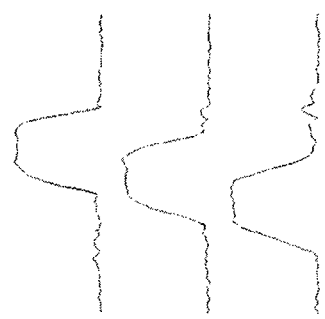

The sequence was:
A,B,A,B,C,B,A,B,A,D,A,B,A,B,C,B,A,B,A,D + D,A,B,A,B,C,B,A,B,A

RF BASED SPATIALLY SELECTIVE EXCITATION IN MRI

CROSS-REFERENCE TO RELATED APPLICATIONS

This application is a national entry of International Patent Application Serial No. PCT/CA2008/000866 and claims the benefit of U.S. provisional application Ser. No. 60/924,195, filed May 3, 2007, entitled "Method for Radio-Frequency Nuclear Magnetic Resonance Imaging" and U.S. provisional application Ser. No. 61/071,269 filed Apr. 18, 2008, entitled "RF Based Spatially Selective Excitation In MRI", the entire contents of both each of which are incorporated herein by reference.

FIELD OF THE INVENTION

The invention relates, in general, to spatially selective excitation in magnetic resonance imaging (MRI) using RF pulses, and in particular, to a method of slice (or other) selection using RF pulses without use of a conventional frequency gradient field.

BACKGROUND OF THE INVENTION

The ability to excite a sample within a sample volume in a spatially selective manner is a fundamental technique for MRI imaging, and most MRI equipment is able to do this. For example, the most common spatially selective excitation involves selectively exciting a slice within the sample while leaving the rest of the sample undisturbed. In a multi-slice mode, a series of (usually parallel) slices are excited in quick succession. Other loci of spatial selection are used for different reasons, including those that correspond to axes of Cartesian, polar, cylindrical or other coordinatizations of the sample volume, and other loci that involve discontinuous selections, such as in a 2D checkerboard pattern.

In conventional MRI apparatus, slice selection is conventionally implemented using a shaped radio-frequency (RF) pulse applied simultaneously with a gradient in magnetic gradient strength, which is equivalent to a gradient field in resonant frequency.

Applicant's U.S. Pat. No. 7,141,973 teaches a method of effecting magnetic resonance experiments where the RF transmission coil is used to spatially encode the signal as a replacement for or a supplement to applying steps with magnetic field gradients. No method for spatially selective excitation within the sample volume is taught, and none would be expected for a NMR apparatus having the limited resolution demonstrated in '973.

It would be desirable to improve on the system for magnetic resonance imaging without use of gradient coils, to provide for spatially selective excitation. Preferably a high degree of specificity of spatial selectivity is preferred.

SUMMARY OF THE INVENTION

Applicant has recently invented an improvement over '973, specifically providing a method of traversing k-space defined by an image transformation kernel that preferably permits a controlled step size and, further advantageously limits a number of B1 fields required to achieve the traversal. The B1 fields are radio-frequency (RF) fields that are substantially uniform in amplitude over a sample volume of the MRI setup, and have, in one (encoding) direction, a phase gradient. Basically that invention uses the fact that spin magnetization phase in the sample volume accumulates at every step to providing an orderly k-space traversal in an MRI procedure. Control over the step size (and therefore cumulatively controlling the resolution and field of view) is provided by selecting respective phase distributions of the B1 fields, as the difference between the phase gradients determines a size of a step in k-space applied by successive refocusing pulses for generating the B1 fields in alternation. Thus a higher resolution image is provided by the teachings of the provisional by using the accumulation of the phase spins to provide a uniform step size that permits the spanning of larger distances in k-space by iteration of the steps.

This higher resolution capability leads to a possibility to perform slice selection.

Accordingly a magnetic resonance process for selective spatial excitation of a sample volume in a uniform magnetic field is provided, the process comprising controlling an RF coil array adapted to produce a plurality of B1 fields within the sample volume to apply a sequence of refocusing pulses with n of the B1 fields, where n is strictly larger than the number of dimensions in which the spatially selected region of the sample volume is bounded. Each of the n B1 fields has a substantially uniform amplitude, and a respective, different phase gradient, over the sample volume, and accordingly has a respective, different k-space center. The phase accumulation results in each refocusing pulse reflecting a k-space weighting function about the k-space center of the respective B1 field that was used to issue the refocusing pulse, and therefore changes the k-space weighting function with respect to n−1 of the k-space centers. The RF coil array is also controlled to apply a sequence of small flip angle pulses with at least one B1 field interspersed between the refocusing pulses. The small flip angle pulses have intensities and durations modulated to distribute the deposition of energy in the k-space weighting function in accordance with a desired selective spatial excitation.

The RF coil array may include a power supply selectively coupled to a plurality of RF coils such that at most one RF coil can be energized at a time, and may include a programmed controller for rapidly switching the RF coils to the power supply. Alternatively the RF coil array may be a plurality of array elements having controlled phase and power so that a plurality of the elements are energized concurrently to produce a single B1 field. In some embodiments one or more of the same n B1 fields of the RF coil array is used for both emitting and detection.

While in principle any B1 field may be used to selectively deposit energy in the k-space weighting function at a given point, and in certain circumstances fields that are not uniform in amplitude over the sample volume may actually be preferred, it will be appreciated that it may be preferable to apply the small flip angle pulses using one or more of the n B1 fields. This can reduce a number of coils required, or a complexity of the programming of the coil elements. It can also reduce the length of the pulse train needed to deposit a given number of points of energization on the k-space weighting function if multiple B1 fields are presented with different points on the k-space weighting function.

The refocusing pulses may be applied in two phases: a spreading phase during which the emitted refocusing pulses with the n B1 fields move the k-space weighting function monotonically away from the origin of k-space, followed by a recentering phase during which the k-space weighting function moves monotonically towards the origin of k-space. The recentering phase naturally moves the k-space weighting function half the distance towards the origin that the spreading phase moved out so that the k-space weighting function is centered on the origin.

Each refocusing step flips the k-space weighting function about the k-space focus of the B1 field used to refocus. At most one small flip angle pulse can be emitted with each of the n B1 fields in each interval between two successive refocusing pulses to provide non-redundant energy deposition. To avoid redundant energy deposition a B1 field used for refocusing can only be used in either the interval immediately before or the interval immediately after the refocusing pulse, but not both, although the B1 field can be used in any other interval.

No redundant energy deposition will occur if each refocusing step moves the k-space trace into previously unvisited k-space territory. If during a monotonically outward or inward set of steps, the steps taken are maximally large, each step will move the k-space to previously unvisited k-space. Naturally an inward trajectory must follow an outward trajectory and accordingly will, in most situations, flip the k-space weighting function back to previous points visited in the same echo train and so some or all points may not be unique.

In principal there is no requirement to avoid redundant deposition of energy in the weighting function, as a simple superposition of the energies will result. There is an efficiency of the number of points deposited given the number of refocusing pulses and B1 fields used for small flip angle pulses, and this may be optimized.

It may be preferable to define, for each direction of imaging, a respective set of at least 2 B1 fields. Each set of at least 2 B1 fields preferably have collinear k-space foci. In certain embodiments it is preferred to have the line passing through the k-space foci also passing through the origin of k-space (or of the k-space center of the receive coil). A constant phase B1 field (i.e. zero phase gradient) may be a member of each of the sets of B1 fields. It may be preferred to use two B1 fields having g °/mm and −g °/mm phase gradients in the encoding direction, respectively, because such coils are symmetric and so both can be designed and fabricated to have the same tolerances and efficiencies, and because a 2 g gradient difference provides a larger step size than alternatives, which is useful if the B1 fields are to be used for high resolution k-space traversal.

The encoding directions may preferably be: orthogonal, and/or linear. Of course radial, and azimuthal, or other arcuate encoding directions may be used, according to any coordinatization of the sample volume desired that can be achieved with phase gradient coils.

If the encoding directions are linear, and the spatial selection is that of at least one slice or other region bounded by parallel planes orthogonal to a linear encoding direction, during at least one of the spreading phase and the recentering phase, applying a sequence of small flip angle pulses may comprise applying the n B1 fields in a repeating pattern of one or more refocusing pulses followed by one or more small flip angle pulses, the pattern having a period of 2 successive refocusing pulses. For example there may be a fixed number of small flip angle pulses between successive refocusing pulses. The fixed number may preferably be the number of the at least two B1 fields in the set less one, if the sequence of refocusing pulses at each step presents a different part of the k-space weighting function to the each of the at least two B1 fields, except for the B1 field used to produce the last refocusing pulse.

During the recentering phase the k-space walk may be different than that taken during the spreading phase to present new points on the k-space weighting function to the at least two B1 fields, so that applying small tilt angle pulses during the recentering phase improves a density of the points on the k-space weighting function. This can be performed when the walk is in a path oblique to linear encoding directions, or when a smaller step is taken between the spreading and refocusing phases.

While in principal any method for stepping through k-space can be used, it is practical to use the same B1 fields for both k-space traversal and for deposition of energy in the k-space weighting function. These may also be used for k-space traversal during read out after the desired k-space weighting function is produced, and also for read out. Thus advantageously spatially selective MRI can be performed using only a static magnet and an array of RF B1 fields. It may be also beneficial to use separate coil or coils for excitation and refocusing. An excitation coil can be local, or non-uniform in amplitude over the sample volume.

It is also possible to interleave excitation steps where the spatially selected regions for excitation are of disjoint regions of the sample volume. This permits an acceleration of the acquisition of multiple slices or other spatial selections before relaxation is complete.

Further features of the invention will be described or will become apparent in the course of the following detailed description.

BRIEF DESCRIPTION OF THE DRAWINGS

In order that the invention may be more clearly understood, embodiments thereof will now be described in detail by way of example, with reference to the accompanying drawings, in which:

FIG. 4a is a schematic illustration of a 2D RF transmit array capable of producing phase gradient fields in two orthogonal directions;

FIG. 5a is a schematic illustration of a pulse sequence for slice selection;

FIG. 5c is an explicit listing of a sequence of pulses in accordance with the pulse sequence scheme of FIG. 5a;

DESCRIPTION OF PREFERRED EMBODIMENTS

Herein a method for slice selection is provided in an MRI process, the method involves controlling a transmit array by adding low flip angle RF pulses interspersed between refocusing pulses that are used to move a k-space weighting function with respect to one or more B1 fields used to deposit energy according to a desired k-space weighting function. The low flip angle pulses deposit energy so that an envelope traced by the low flip angle pulses in the k-space weighting function is related to a desired spatially excited region of the sample volume, for example by a Fourier transform, if the phase encoding directions are linear axes that coordinatize the sample volume, and the B1 fields have linear phase gradients.

Herein terms of mathematical idealization are used to refer to orientations and properties of fields (constant, linear, uniform) and the coils or array of elements used to produce them. It will be appreciated by those of skill in the art that any idealization is intended to convey a reasonable range or an approximation to the idealization as befits the term in the context of the embodiment.

Figure 1A:
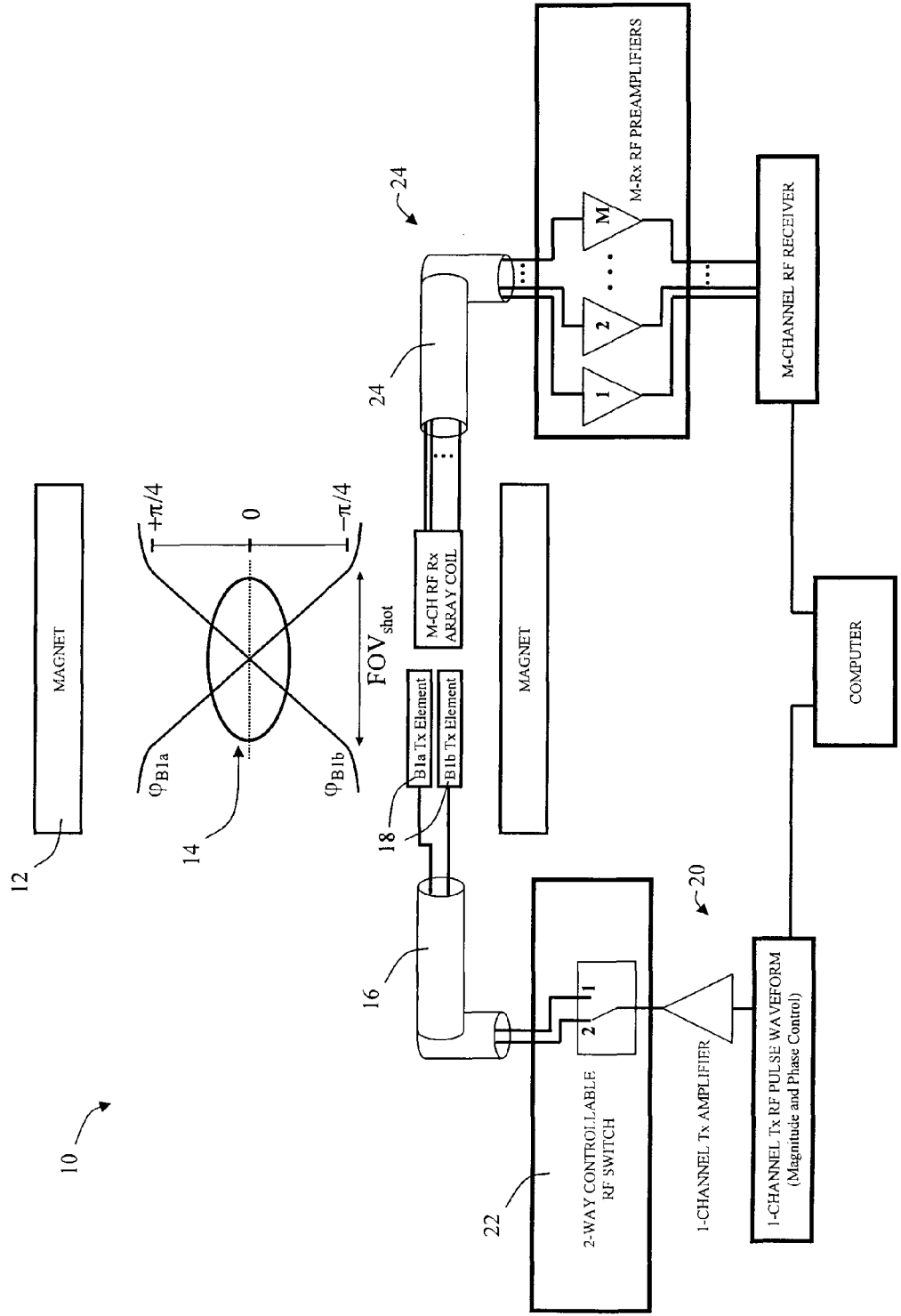
FIGS. 1a-c are schematic illustrations of equipment for effecting the present invention.

FIG. 1*a* is a schematic drawing of a MRI setup 10 in accordance with an embodiment of the invention. MRI setup 10 includes a static magnet 12 for generating magnetization signal from an object within a sample volume 14 of the MRI setup 10. In this embodiment, no gradient coils or associated electronics are required, and a single RF transmitter array 16 consisting of two transmit coil elements 18 (Tx-coil A, and Tx-coil B) is selectively coupled to an electrical power source 20 by a two-way switch 22. Two-way switch 22 is adapted to deliver RF pulses from the electrical power source 20 to either Tx-coil A or Tx-coil B, which produce required B1 fields $B1_a$ and $B1_b$, as further described below. An M-channel receive phased array 24 is shown for signal reception, as an example of detection means for measuring responses/echoes from the object, although other detection schemes could equally be used, including those that use the same B1 fields as produced by the TX-coils A,B 18.

Figure 1B:
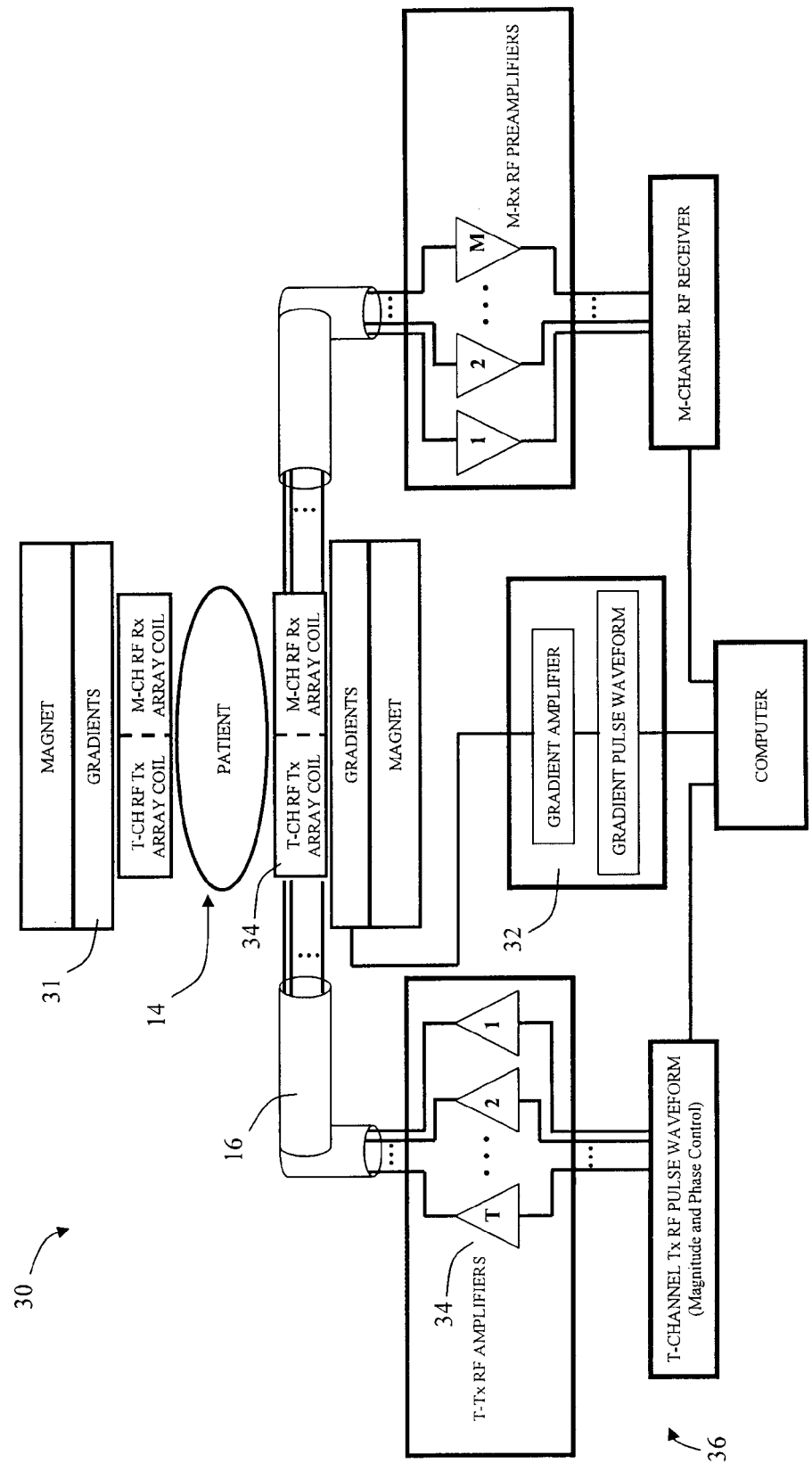

FIG. 1*b* is an alternate embodiment of the invention. MRI setup 30 is shown that differs from that of FIG. 1*a* in that traditional gradient coils 31 and associated electronics 32 are included, and in the constitution of the RF transmitter array 16. Insofar as MRI setup 30 is identical to MRI 10, the features are not described again. The use of traditional gradient coils 31 in conjunction with the invention may be advantageous, in transmit TRASE embodiments to replace some of the magnetic field gradient pulses. For example, transmit TRASE embodiments may be used for spatial encoding in one spatial direction, and traditional magnetic field gradient encoding could be used in another spatial direction. Alternatively TRACE encoding may be performed for slice selection and traditional gradient amplitude magnetic fields can be used for readout.

The RF transmitter array 16 shown in FIG. 1*b* includes a multi-channel transmitter 34 having many transmit elements spatially arranged, and for each element thereof, a respective RF power supply 36 is independently coupled. Each element receives RF pulses that are independently phase and magnitude controlled so that the superposition of the fields produced by the elements subjected to the individually phase and amplitude adjusted RF pulses produce the desired $B1_a$ or $B1_b$ within the sample volume 14. Naturally control and timing signals are required to implement parallel modulation of the RF pulses, and the RF pulses may be shaped in a manner known in the art. In this embodiment the $B1_a$ or $B1_b$ fields are generated by altering the phase and magnitude of the RF transmit signals applied to elements of the Tx-array.

In this embodiment the same elements can be used for both transmission and reception, for example by switch-coupling the elements to both receiver channels and the respective RF power supply, or separate elements may be used for transmission and reception, as shown.

Figure 1C:
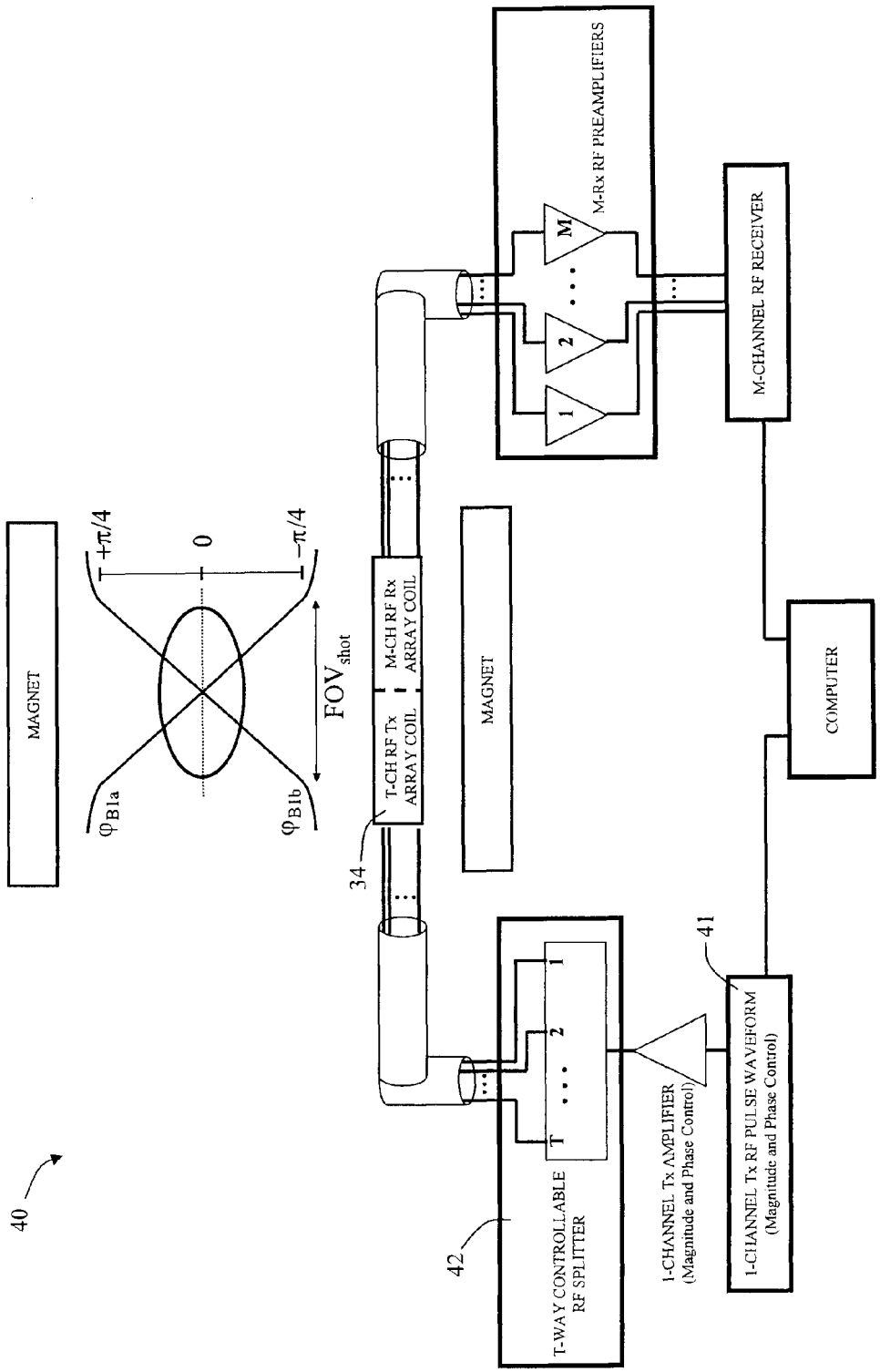

FIG. 1*c* is a schematic illustration of a MRI setup 40 in accordance with a further embodiment of the invention in which the multi-channel transmit (Tx) phased array 34 is driven by a single RF power supply 41, via a phase and magnitude controllable RF signal splitter 42 so as to produce the required $B1_a$ or $B1_b$ fields in alternation. The remainder of this embodiment is the same as FIG. 1*b*, and will not be described again. It will be apparent to those of skill in the art that the number of RF power supplies, and elements of the transmit array can vary according to system requirements, and further that there are numerous electronically equivalent control mechanisms and architectures possible for interconnecting the one or more RF power supplies with the two or more transmit array elements.

While the foregoing examples show a multi-channel receive phased array, it will be appreciated that in simplified embodiments a single channel receiver may be used, and that there may be advantages to using multiple different phase distribution Bl fields for receiving.

Transmit Coil Arrays

A B1 field with a particular phase distribution and uniform amplitude across the sample volume can be generated in several ways. In general, a multi-transmitter 34 schematically shown in either of FIGS. 1b,c can be used where the RF pulses transmitted into a plurality or all elements of the array at substantially the same time, but the RF signal amplitude and phase delivered to each array element is independently controlled such that the resultant B1 field, which is simply a superposition of the individual fields created from each array element (assuming no coil coupling), is the desired field such as $B1_a$. For the next refocusing pulse, the amplitude and phase of the RF transmit signals delivered to each element is adjusted such that the resultant total field produced by the Tx-array is now the $B1_b$ field.

Figure 2:
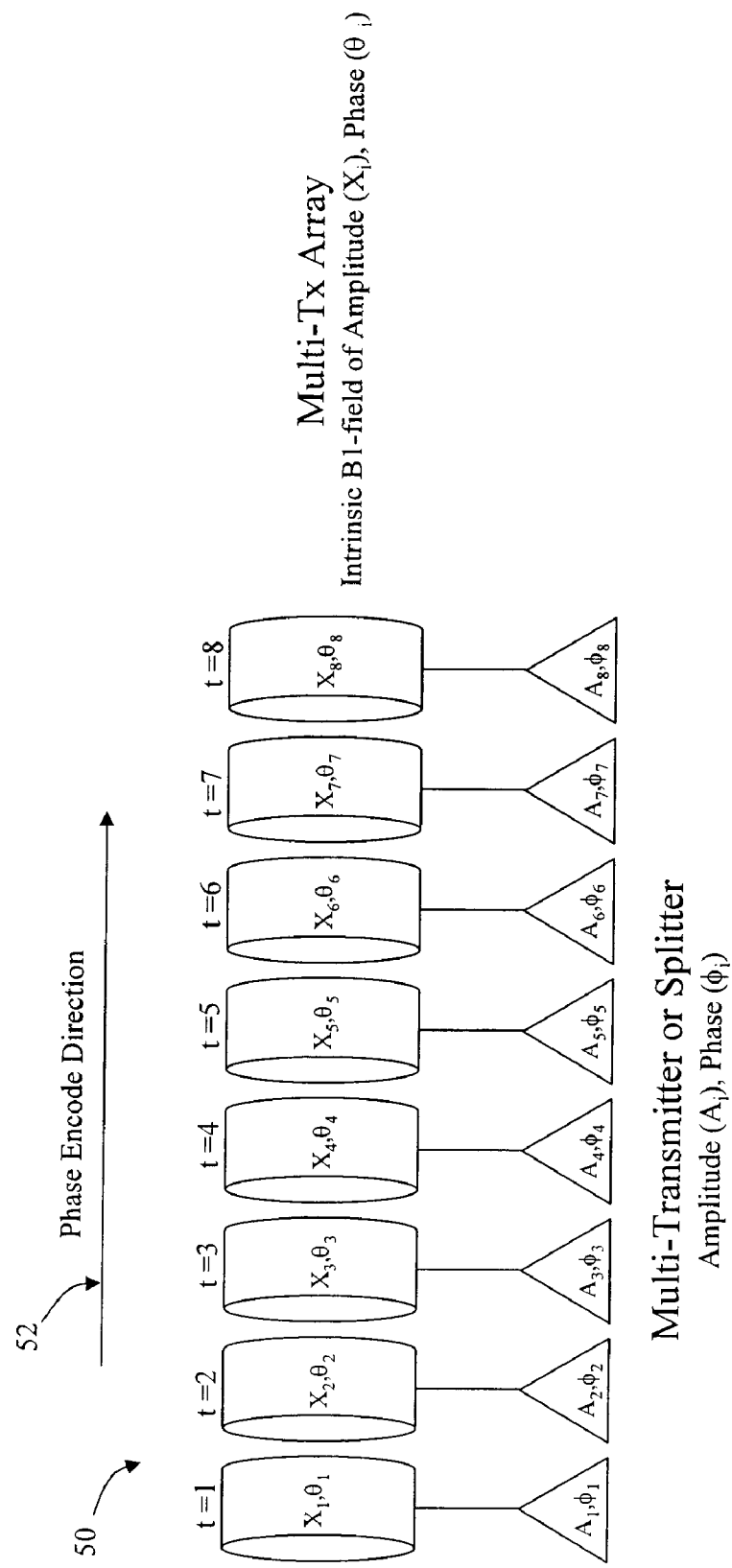
FIG. 2 is a schematic illustration of a RF transmitter array adapted to generate a phase-distributed B1 field.

FIG. 2 is a schematic illustration of an example of an 8-element array 50 that might be used to generate a particular B1 field phase distribution along a particular line labeled as the phase encoding direction 52. If all elements of the array depicted have substantially similar electrical properties, and are driven with a common RF voltage with a particular amplitude and phase, each would produce a field that has the same amplitude and phase, but over different spatial regions along the encoding direction. Altering the phase of this applied voltage to any one of the elements results in that element's B1 field having a phase relative to the other B1 fields that is different, e.g. rotated in a clockwise or counterclockwise fashion relative to the B0 direction. Therefore, by applying the RF voltage to the individual elements with a voltage-phase shifted by pi/4 clockwise relative to the previous elements voltage moving along the encoding direction, the last element would produce a B1 field with a 2 pi clockwise phase relative to the first element. When driven in such a way, the resultant superposition B1 field would have a phase that starts at zero, and rotates clockwise through 2 pi, along the encoding direction. If the voltage phase applied to each element is altered as to produce successive pi/4 shifts in a counterclockwise fashion, then the resultant B1 field would now have a phase that starts at zero, and rotates counter-clockwise through 2 pi, along the encoding direction. Thus if the first B1-field ($B1_a$) has a +2 pi phase gradient, and the second B1-field ($B1_b$) has a −2 pi phase gradient, a difference of 4 pi over the length of the array is produced by alternation of the $B1_a$ and $B1_b$ pulses.

FIG. 3A shows a two-element array 60 where each element 62,64 has a physical geometry and conductor layout such that when an RF pulse is delivered to either element, the element inherently produces the required phase distribution of the $B1_a$ or $B1_b$ fields, respectively. For example, the two-element array 60, with the first element 62 consisting of a first spiral birdcage coil with a clockwise twist along its axis of +2 pi, which results in a region 68 with a substantially uniform amplitude field with linear $B1_a$ phase distribution of +pi, and the second element 64 consisting of a second spiral birdcage coil with a counter-clockwise twist along its axis of −2 pi, which results in a region with a substantially uniform amplitude field with linear $B1_b$ phase region distribution of −pi.

FIG. 3B plots the phase gradients of the two birdcage coil elements 62,64 as a function of axial position within the array 60 (degrees of phase are listed on the right hand vertical axis), and the uniformity of the amplitude of the field within the coil as a function of the axial position (left hand vertical axis shows dB loss). It is noted that at least within the 5-20 cm range the losses are substantially uniform (−48 to −52 dB), and that the substantially linear phase gradients within this range vary by about 180 and −180 degrees, respectively.

FIG. 4a is a schematic illustration of a 2-element array 80 for producing two B1 fields of constant amplitude and linear phase distribution over the sample volume, upon energization by controlled, selected RF pulses delivered to each element. Two different sets of RF pulses are delivered to the respective elements, the RF pulses having amplitude, phase and waveform selected so that a particular phase distribution is achieved.

Figure 4B:
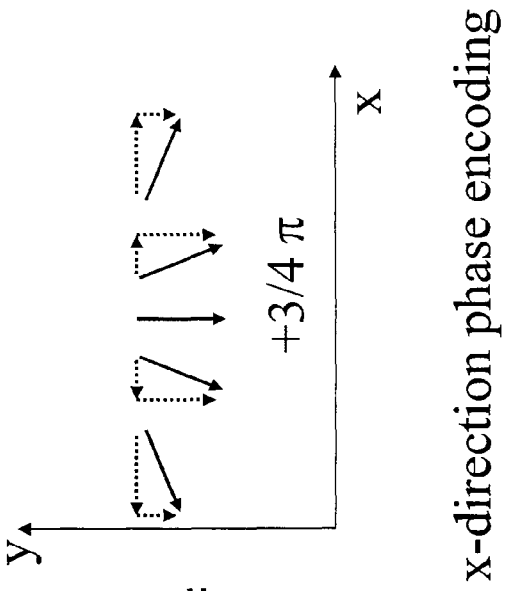
FIG. 4b is a schematic illustration of a RF transmit array design utilizing pairs of loops energized to produce co- and counter-rotating current, respectively that produces a phase gradient in the x-direction.
Figure 4B:
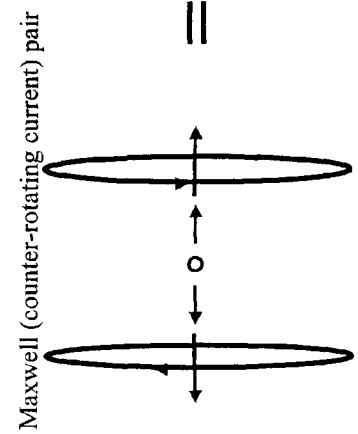
Figure 4B:
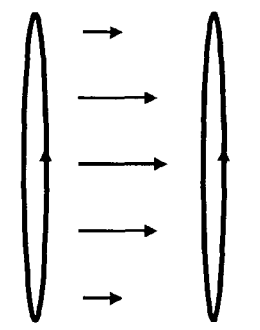
Figure 4B:
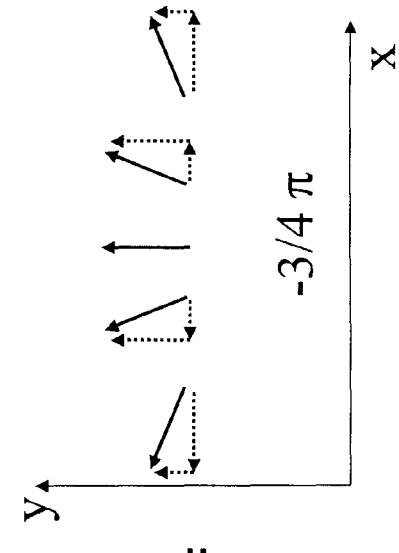
Figure 4B:
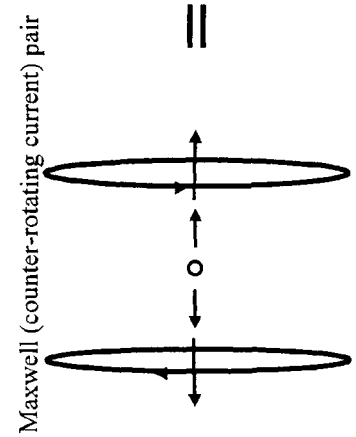
Figure 4B:
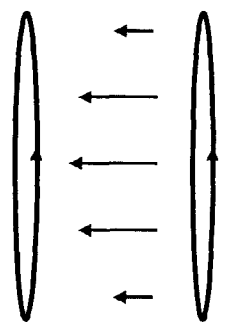
Figure 4C:
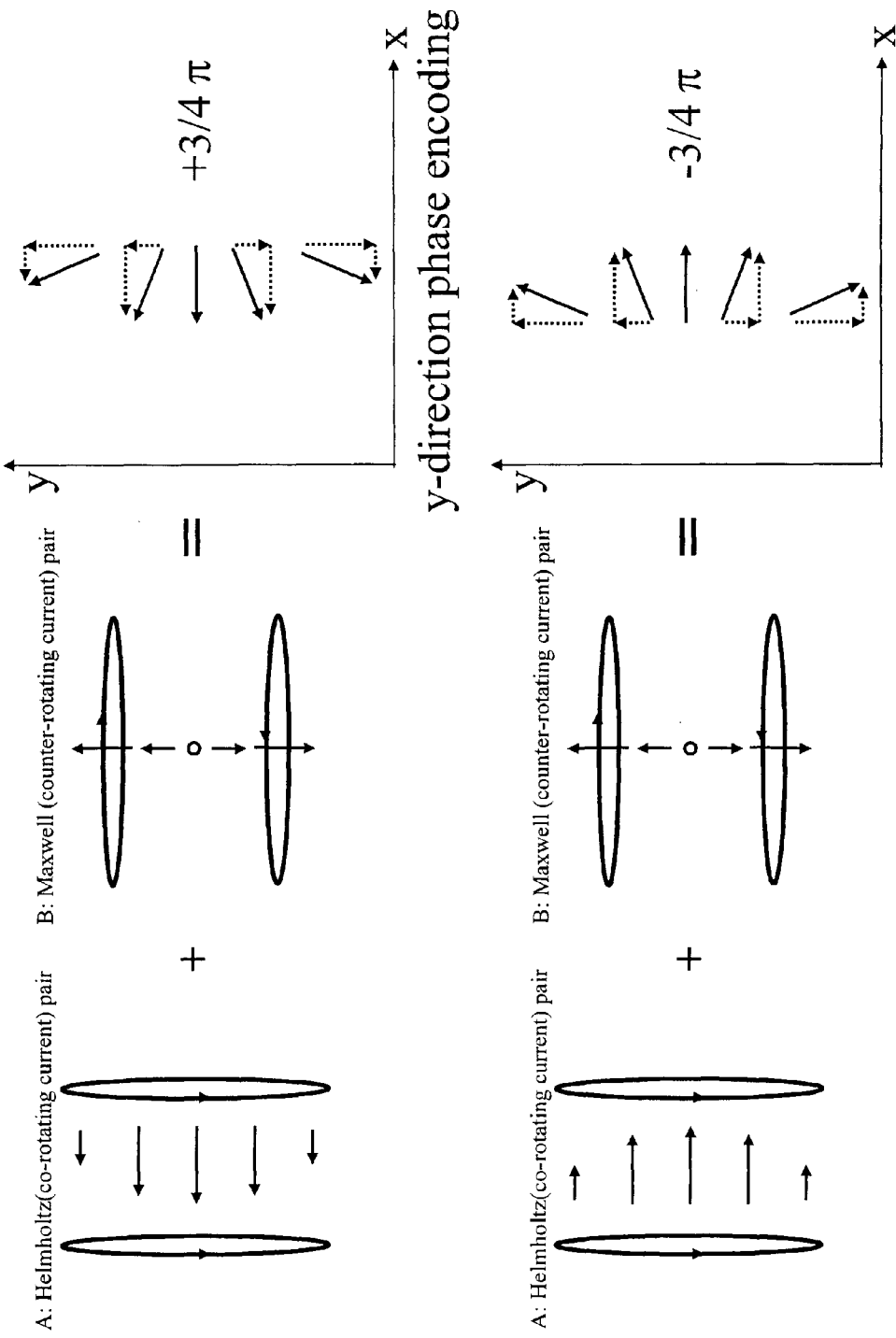
FIG. 4c is a schematic illustration of a RF transmit array design utilizing pairs of loops energized to produce co- and counter-rotating current, respectively that produces a phase gradient in the y-direction.

FIG. 4b,c are schematic illustrations of a 4-element array for producing a B1 field of constant amplitude and linear phase distribution in the x-direction (FIG. 4b) and y-direction (FIG. 4c) of the sample volume, upon energization by controlled, selected RF pulses delivered to each element so that a controlled phase distribution can be achieved. The 4-element array consists of two pairs of coils, the paired coils are parallel and oppose each other with the sample volume in between. The parallel planes of the two pairs are orthogonal to each other to enclose the sample volume.

One of the pairs (referred to as a Helmholtz pair) has coils that is driven so that the electrical current flows in a same direction as each other (co-rotating coils). In the other pair (Maxwell pair) has coils that are driven so that the electrical current flows in opposite directions (counter-rotating coils).

In the embodiment produced, the Helmholtz pair has 3-turns whereas the Maxwell pair has 1-turn, such that for equal power splitting to each pair, the Helmholtz B1-field magnitude will be approximately three times stronger, which when combined with the Maxwell pair B1-field will produce a substantially uniform amplitude phase gradient field.

It will be appreciated that two different sets of RF pulses could be delivered to the respective pairs, the RF pulses having amplitude, phase and waveform selected so that a particular phase distribution can be achieved, and further that 4 different RF pulses could be supplied to each coil. This would allow the same coils to be used for both x and y encoding and for encoding 0 phase gradient fields.

Figure 4D:
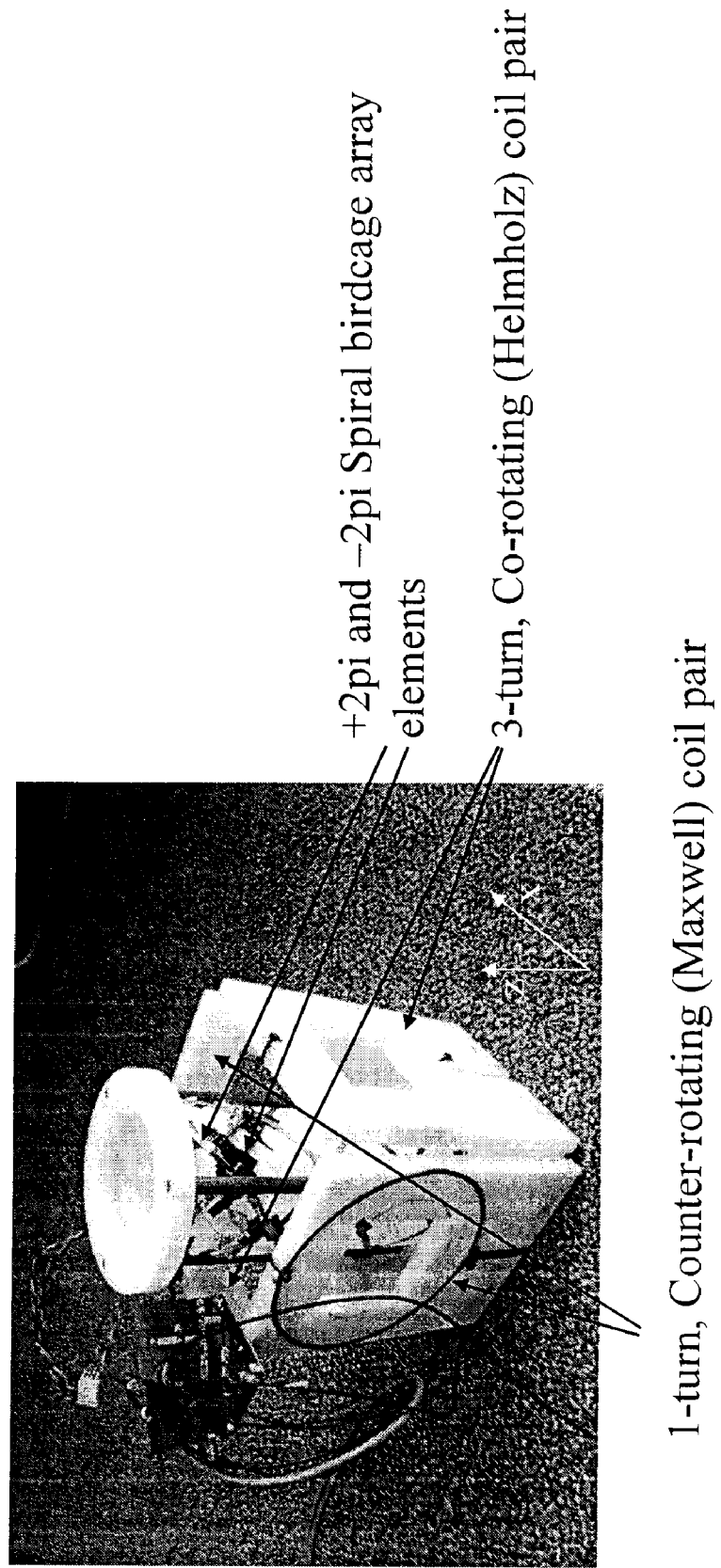
FIG. 4d is an image of a transmit array used for 2D spatial encoding adapted to produce phase gradients in a z-direction (vertical) and an x-direction using spiral birdcage array elements as well as pairs of loops for co- and counter-rotating current.

FIG. 4d is an image of a Tx-array coil used for 2D imaging containing a +2 Pi and −2 Pi spiral birdcage coil for z-direction phase encoding (vertical) and a co-rotating pair of three turn loops together with a single turn counter-rotating pair of loops, which when energized in parallel using (in this case a single transmitter with a power splitter), produce two more phase gradients in the x-direction (+¾ pi and −¾ pi). A fifth field with a zero phase gradient (referred to as a uniform field) is also achieved by energizing only the co-rotating current Helmholtz field portion of the array as shown in FIG. 4b.

In Fourier based MRI, the image transform kernel is a complex exponential involving variables k, and r (position). Hence, the phase term in the kernel depends on position. This is well suited for MRI since the magnetization also processes about the B0 magnetic field where the phase angle of the transverse magnetization in a plane transverse to the B0 field direction is dependent on the precession frequency. In standard MRI encoding, an amplitude gradient magnetic field is used, that is linear with position along an encoding direction. Therefore, the phase of the transverse magnetization will have a linear dependence upon position in the gradient encoding direction. In the TRASE MRI method, at least one B1 field with phases that vary linearly with position in the encoding direction is used. Although linear transformations are well known, corrections can be made to the reconstruction if the phase distribution of the B1 fields is not linear with position along the encoding direction. Alternatively, an entirely different image transformation can be accomplished using a wavelet transform that would require the phase distribution of the B1 fields to satisfy the phase basis requirements of the particular wavelet transform used.

B1 Field Phase Distributions

Within an object in a sample volume of the MRI static magnet, an excitation of the sample will cause nuclei to process about the B0 field, where the frequency of precession is proportional to the B0 field strength. Therefore, for a uniform B0 field, in the absence of any magnetic field amplitude gradients, the phase of magnetization signal contributions from different spatial locations is constant. To provide spatial encoding in traditional MRI, the phase of this transverse magnetization signal at different spatial positions is made to depend on the spatial position along a selected encoding direction. The signal received by a detection coil sensitive to processing transverse magnetization is given as, $$S_n(k) = \int dr M_{xy}(r) e^{i\phi(r)} = \int dr M_{xy}(r) e^{i(2\pi k \cdot r)} = \int dr M_{xy}(r) e^{i(2\pi n \Delta k \cdot r)}$$

The unknown quantity of interest is the density of atoms at a particular position which is proportional to the transverse magnetization $M_{xy}(r)$, and can be computed using a Fourier transformation. In typical Fourier encoded MRI, this is done using magnetic field gradients which act to alter the precession frequency linearly with distance, such that the phase change in the encoding direction can be described as an azimuthal rotation in the transverse plane of magnetization at different positions, which is, in general, a linear change in the phase angle of the transverse magnetization signal at different positions along an encoding direction. Therefore, in the encoding direction, the magnetization phase follows a circular/azimuthal rotation relative to the phase at a reference position along this encoding direction. The traversal through k-space with equal size steps Δk, can occur as equal time steps while applying a constant gradient (frequency encoding), or alternatively using phase encoding, as multiple applications of a gradient pulse of amplitude nΔG, for a fixed time T. In this phase encoding technique, the signal in k-space is given by, $$S_n(k) = \int dr M_{xy}(r) e^{i(\gamma n \Delta G T \cdot r)}$$

The aim of Fourier-based TRASE methods is to create equivalent magnetization phase as a function of position, without using changes to the B0 field (that is, without magnetic field gradients). This can be accomplished by applying excitation and refocusing pulses to generate a B1 field with the phase of the B1 field that possess a different phase as a function of position in an encoding direction as the magnetization would have due to one such pulse of a magnetic field gradient applied, i.e. along a coordinate direction of a coordinatization of the sample volume.

A second B1 field is required that has a different spatial distribution of phase gradient in the encoding direction than the first B1 field. This means that either of the two B1 fields may have a phase distribution that is constant along the encoding direction, as long as the other possesses a phase distribution, such that the phase is shifted or rotated in the transverse plane, for different positions along the spatial encoding direction. It is the gradient in the phase difference that is important for this technique.

An exemplary spatial phase distribution for each of these B1 fields is shown schematically in (FIGS. 1a,b,c) in one dimension, the spatial phase distributions are linear, producing constant gradient fields and thus define a coordinate direction (Cartesian axis) of the sample volume. While in the examples described herein the encoding direction is a linear axis, it will be appreciated that radial or azimuthal axes corresponding to different coordinatizations of the sample volume are equally possible giving rise to encoding directions. Both of the B1 fields have phase gradient fields in the same coordinate direction (along the same axis, but of opposite signs), and so the difference between the phase gradient fields in the coordinate direction is uniformly defined. In this example, the difference in these phase distributions over the sample volume is equal to pi. As such, each B1 field required must have the form:

$$\vec{B1}_a(r) = B1_a e^{i[\Phi_a(r)]}$$

where the magnitude as a function of position in the encoding direction is substantially constant, but the phase of the field varies spatially such that the transverse phase angle varies linearly with position in the spatial encoding direction. A further discussion of B1 fields and methods of producing them is found in applicant's copending application filed May 1, 2008 entitled METHOD FOR RADIO-FREQUENCY NUCLEAR MAGNETIC RESONANCE IMAGING, the contents of which are incorporated herein by reference.

Selective Spatial Excitation

An advantage made use of in TRASE MRI is the persistence of energy deposition that enables phase accumulation to permit a k-space weighting function to move energy deposited during previous intervals between refocusing pulses, which flip the k-space weighting function with respect to the k-space focus of the B1 field that was used for the refocusing. This permits an accumulation of steps that can be used to achieve a k-space weighting function definition and resolution of the spatial selection limited by the number of steps available, and the difference in phase gradients of the B1 fields (step size): a best definition of the k-space weighting function and Field of View (FOV) is provided by covering the largest area of k-space (high resolution) with the smallest step size (FOV). Given the limited number of step sizes permitted within a single shot, a higher definition of the k-space weighting function (higher spatial resolution) but lower FOV can be provided by increasing the step size. Typically uniformity of the coverage of k-space is desired so that there is well-defined field-of-view.

Controlling a transmit array to add low flip angle RF pulses interspersed between refocusing pulses allows the accumulation of the deposited energy in the k-space weighting function that can be used to selectively excite a region within the sample volume. The density of the deposited energy in the k-space weighting function is directly proportional to the aliasing artifacts within the field of view.

1D Selective Excitation Pulse Train Using 2 B1 Fields and Uniform Field

Selective excitation pulse trains are a train of refocusing pulses with additional pulses placed between the refocusing pulses. These additional pulses will individually be of low flip angle. A first apparatus of the invention comprises a static magnet and, for a single dimension a pair of B1 fields having opposite linear phase gradients, along with a RF B1 field having a uniform phase.

FIG. 5a schematically illustrates a truncated 1D pulse sequence using this apparatus. The truncated pulse sequence consists of alternating $B1_a$ and $B1_b$ refocusing pulses interspersed by one small flip angle pulse in each interval. The small flip angle pulse is produced using a uniform (null) gradient field. FIG. 5a shows the pulse sequence schematically with the repeated pattern of: [Low-Flip-Angle-Pulse1—Refocusing Pulse A—Low-Flip-Angle-Pulse2—Refocusing Pulse B—etc.].

Figure 5B:
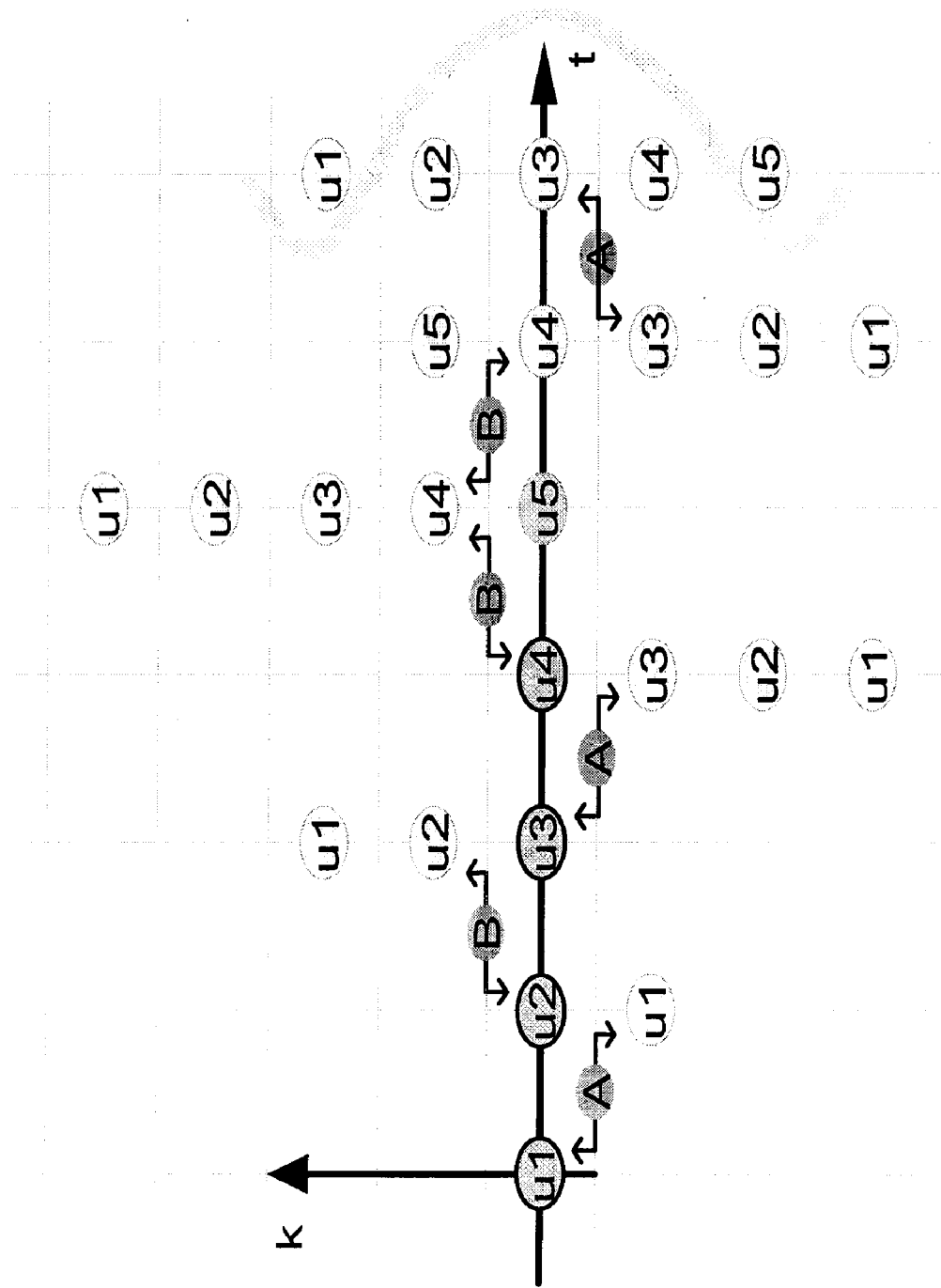
FIG. 5b is a schematic illustration of a k-space weighting function using maximal k-space stepping as shown in FIG. 5a during a spreading phase, with deposition of energy from a uniform field.

FIG. 5b schematically illustrates sequential deposition of energy in the embodiment of FIG. 5a. The spin phase accumulation is represented by the energy deposited at steps $p_i$ being reflected with the refocusing pulses about A and B, (i.e. the k-space foci of $B1_a$ and $B1_b$), and thus, by the third refocusing, ($4^{th}$ small flip angle pulse) the energy deposited by the first small flip angle pulse will have moved to a position 6 times the distance A (or B) from the origin. This is an artificially short pulse train but shows how, during an initial spreading phase of an excitation sequence, k-space traversal with deposition of energy at respective k-space points of the k-space weighting function can occur. It will be noted that the number of k-space weighting function points grows with each small flip angle pulse inserted between each refocusing step. Subsequent pulses in the train follow the same pattern. The effect of a refocusing pulse using the 'A' transmit field is to refocus the spins about the on-axis point at the line labeled 'A', and similarly for 'B'.

FIG. 5c is a table listing in detail a pulse sequence used for simulation of the excitation process shown in FIG. 5b. It contains 29 interleaved small flip angle pulses 10 and 14 pairs of 180 degree refocusing pulses 3, 4 (pulses 1-57) and is followed by a series of 7 pairs of alternating refocusing pulses 58-71 only (using the reversed pattern—BA) to recenter the k-space weighting function on the origin, which causes rephasing across the excited slice. It will be noted that the small flip angle pulses at each point have different amplitudes and signs to modulate the energy deposited on the k-space weighting function to approximate with these discrete points a sine waveform. Additionally it is necessary to invert the phase of alternate small-flip-angle pulses due to the phase-reversal effect of the 180 degree pulses.

Figure 5D:
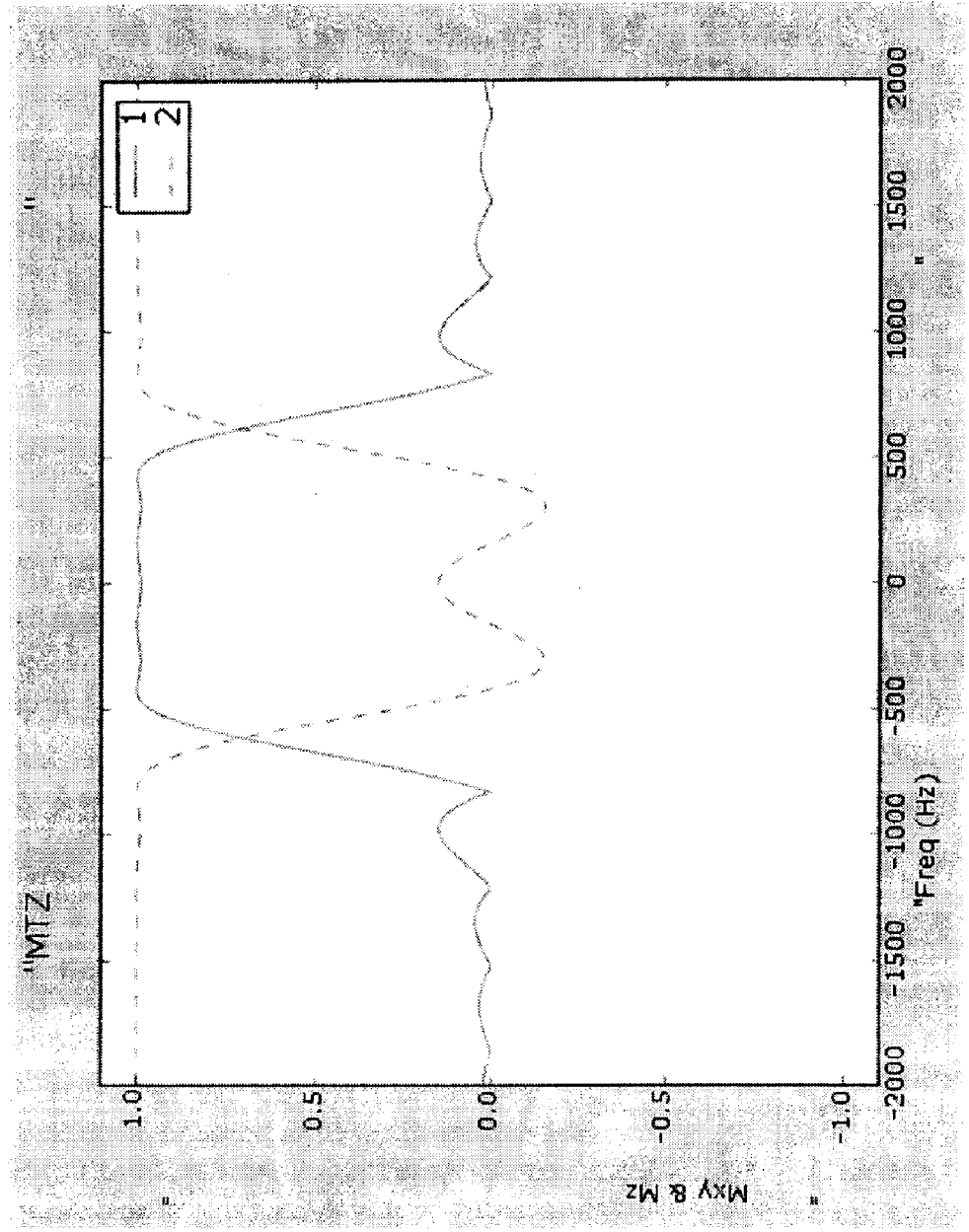
FIG. 5d-g are plots of diagrams showing ideal and realized results of slice selection simulations, in particular having regard to the magnitudes of transverse and longitudinal magnetization and the phase and flip angle.

FIG. 5d shows the target (design) profile for slice selection. This is approximately the Fourier transform of the sinc excitation envelope. A slice profile (thickness) and slice shift can be selected by controlling a shape of the waveform (i.e. the amplitude and phases of the small flip angle pulses). The Fourier transform of the sinc (sin(x)/x) function is a rectangular function. The width of the sinc waveform is inversely proportional to the slice width. In all plots labelled "MTZ", Trace 1 is the magnitude of the transverse magnetization ($M_{xy}$), and Trace 2 is the longitudinal magnetization ($M_z$).

Figure 5E:
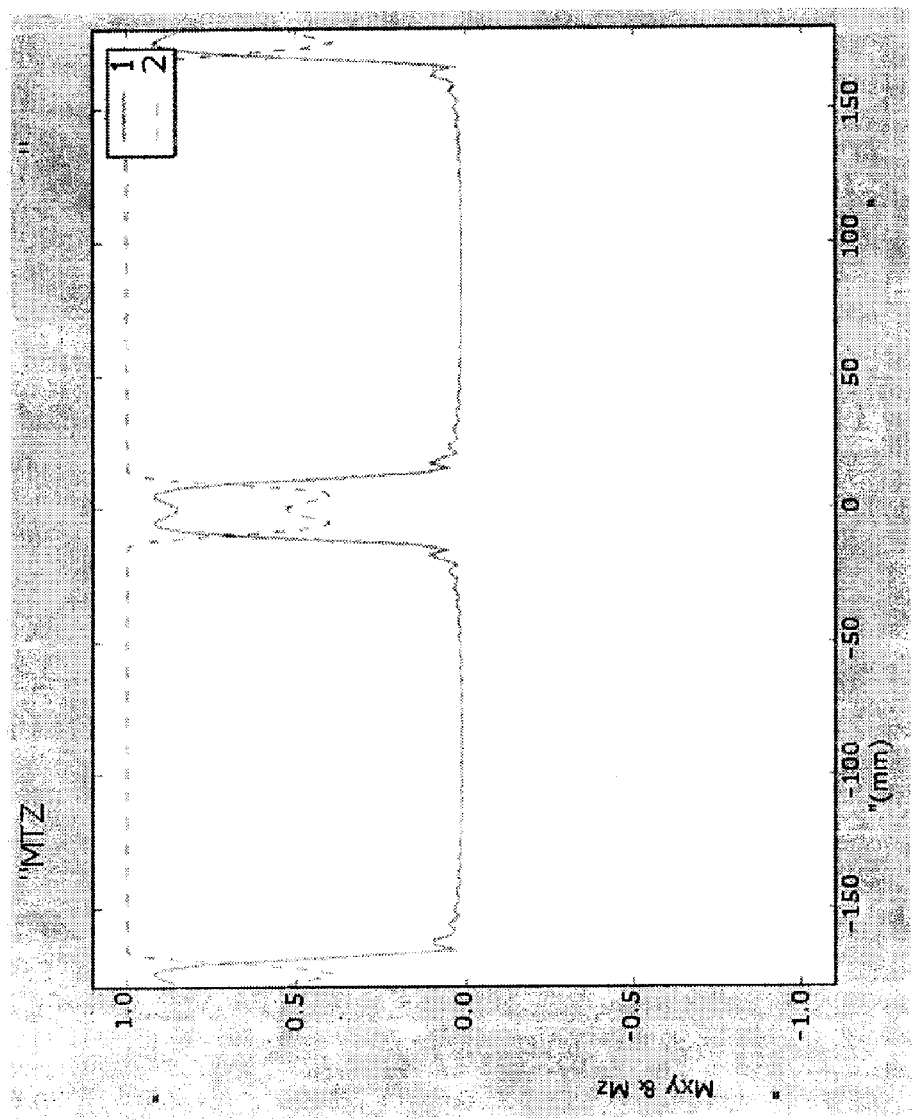

FIG. 5e shows the simulated slice-selection results. This is similar, (but not quite identical) to the target response indicating that the approach is successful. Aliasing is also visible as extra slices excited at the edge of the FIG. 5e.

Figure 5F:
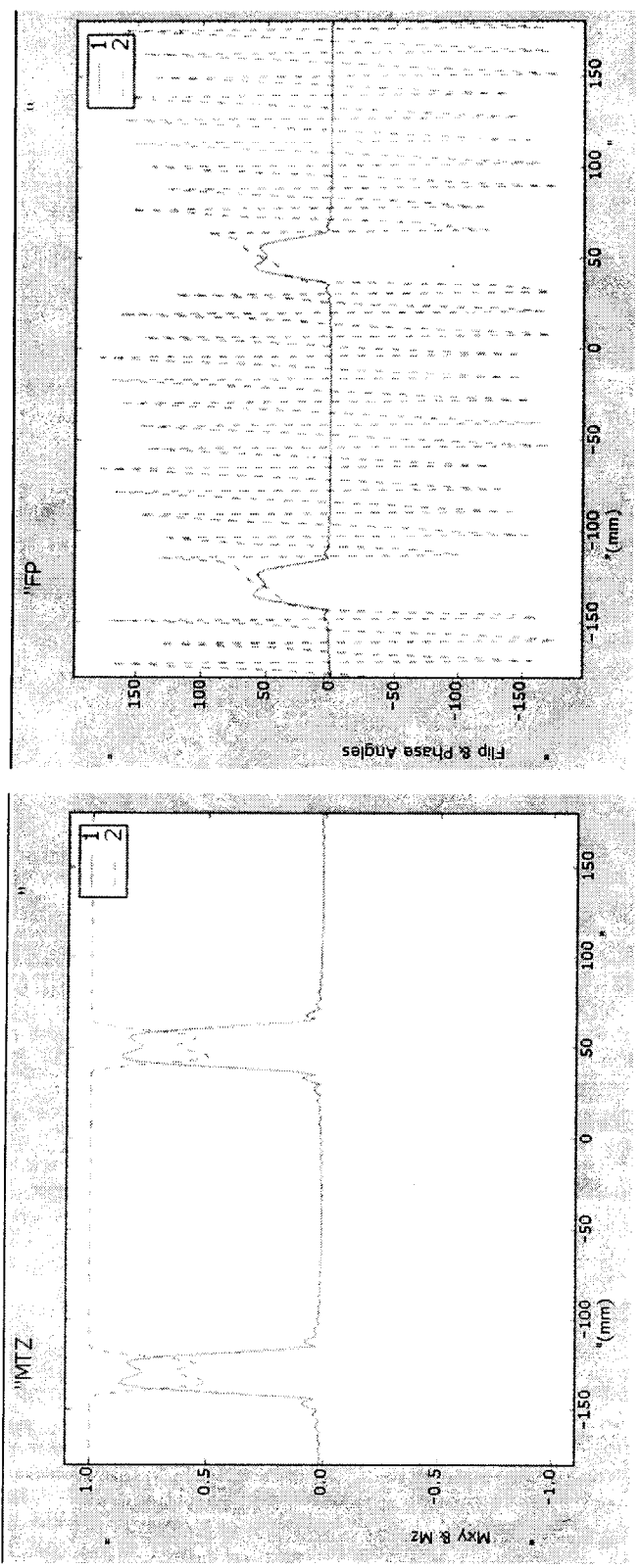

FIG. 5f shows a simulated slice selection resulting in a slice shift. The list of pulses was identical to that shown in FIG. 5c except that the phase and not magnitude of each small flip angle pulse was modified as a linear function of the position within the k-space. Thus each entry in the column entitled soft pulse waveform phase is incremented by a fixed angle with respect to the value of the previous row. This constitutes a complex phase shift which has the corresponding Fourier response (i.e. in the frequency domain) of 3000 Hz. This corresponds to a slice shift in the spatial excitation of the sample volume. It is noted that the slice profile does indeed shift as expected. It is also noted that aliased slice artifacts move together with the central slice. In plots labelled "FP", Trace 1 is the flip angle achieved, and Trace 2 is the phase.

An alternative way ("$2^{nd}$ slice-shift method") to achieve slice shift is to modify the phases of all the pulses in the sequence, including both excitation and refocusing. For a 1D experiment where pulses for each phase gradient field (A,B) are applied with respective phases ($\phi_A$, $\phi_B$) we may identify a definite point in space where the phase difference between the two fields is zero, referred to (arbitrarily) as the center of the field-of-view (or center default slice position) $r_0$, which is given by the condition $2\pi k_{1B} \cdot r_0 + \phi_B = 2\pi k_{1A} \cdot r_0 + \phi_A$ thus $r_0 = (\phi_A - \phi_B)/2\pi(k_{1B} - k_{1A})$.

Figure 5G:
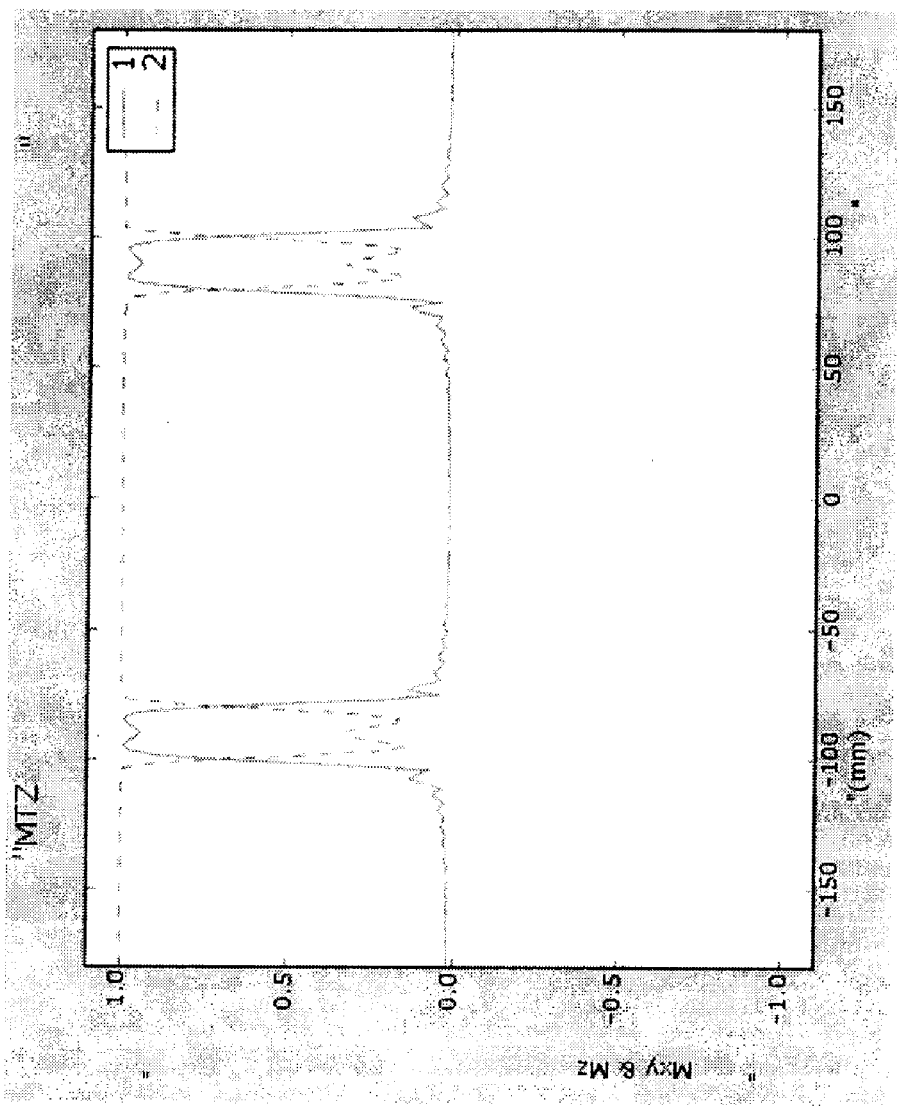

FIG. 5g shows the simulated output of the experiment listed in FIG. 5c except that a composite refocusing pulse (90x-180y-90x) was used in lieu of the simple square refocusing pulse. The simulated output shows improved performance.

Many shaped radiofrequency pulse types can be implemented by this method (Bernstein 2004, Chapter 2). These pulse shapes include Rectangular Pulses, Sinc Pulses, Gaussian pulses, SLR pulses, and Variable Rate pulses. They also include all pulse types: excitation, inversion, refocusing (Handbook of MRI Pulse Sequences—Bernstein 2004, Chapter 3). This also includes spatial radiofrequency pulses (Bernstein chapter 5), including multidimensional pulses, Ramp (TONE) pulses, spatial saturation pulses, and tagging pulses. This also includes adiabatic excitation, inversion and refocusing pulses (Bernstein Chapter 6).

Methods to Reduce or Eliminate Effects of Aliasing in Slice-Selection

Both the $B1_a$ and $B1_b$ fields have a phase difference between opposite sides of a field of view (FOV) in the sample volume. This phase difference is termed a total phase change over the FOV. If the difference between the total phase change of B1a and B1b is at most pi, the object in the sample volume can be spatially encoded in a single shot without correction for aliasing effects, as indicated by the FOV per shot ($FOV_{shot}$). Aliasing is a well known phenomenon resulting in image artifacts. Slice selection using phase gradients that have a difference greater than pi can result in aliasing (see FIGS. 5e,f,g)—that is additional unwanted selected slices. There are a number of approaches that can be used to avoid or eliminate this aliasing while using larger than pi differences in total phase change between $B1_a$ and $B1_b$.

One method of anti-aliasing uses two echo trains (also known as a "shot"), with only two different Tx (B1) phase gradient fields $B1_a$ and $B1_b$ which exhibit a phase twist difference of Phi over a length X. Complete k-space traversal is possible in the direction of this phase difference, by applying refocusing pulses successively with each of the two B1 fields such as: (for 1-D)

1. (A excitation) ABAB . . . ($90^1$)-$180^1$-$180^2$-$180^1$-$180^2$ or,
2. (B excitation) BABA . . . ($90^2$)-$180^2$-$180^1$-$180^2$-$180^1$ . .

where the small flip angle pulses can be applied with either coil, but works nicely if the (90 degree) total excitation is done with the same coil as the first (180 degree) refocusing pulse. By applying the pulse sequence given in (1.) above, then applying pulse sequence (2.) above, and combining the data together, the FOV (after $2^{nd}$ shot) will be twice that of applying only one of the two pulse sequences.

Spatial resolution using TRASE is limited by a difference between the two phase gradients (G1) used to step through k-space, and the number of echoes that are collected in a single shot, and therefore ultimately by the effective transverse decay rate of the transverse magnetization. Also, the FOV is also limited by G1, so wrapping artifacts would be seen if additional k-space points are not collected (using multiple shots with a shifted k-space traversal grid) or calculated (half-Fourier). Therefore, it is expected that parallel imaging could be used to remove wrapping artifacts or increasing reconstructed spatial resolution.

Although TRASE is a new method, the end result is a k-space weighting function, so improvements to unwrapping and resolution using parallel imaging is not altered if the k-space data is acquired using TRASE rather than traditional k-space data collection methods using magnetic field gradients. This is because parallel MRI methods operate on the received data using array element sensitivity information of the phased array used for reception, which in general is different from the Tx-array used for TRASE MRI k-space traversal.

In another method for anti-aliasing, the region where aliasing is liable to occur can be saturated (e.g. a 90 degree pulse is previously applied to affect this region), so that there is no remaining NMR signal.

In a further approach the excitation coil field can be arranged so as not to excite the regions vulnerable to aliasing. This can be achieved by using a sufficiently small emitter coil. A restricted extent of excitation coil could be used to avoid exciting aliased responses.

Yet another approach is the use of a restricted extent of Rx coil avoids detection of aliased responses. This is the use of a receiver coil that is small enough so that it does not detect the signal from the aliased slices.

In yet another approach, multiple receive coils used in a parallel imaging mode (Top Magn. Reson. Imaging 2004; 15:223-236, M Blaimer, F Breuer, M Mueller, Robin M. Heidemann, M A. Griswold, and Peter M. Jakob, SMASH, SENSE, PILS, GRAPPA) can be used to distinguish and hence separate out the signals from the aliased slices.

Figure 6:
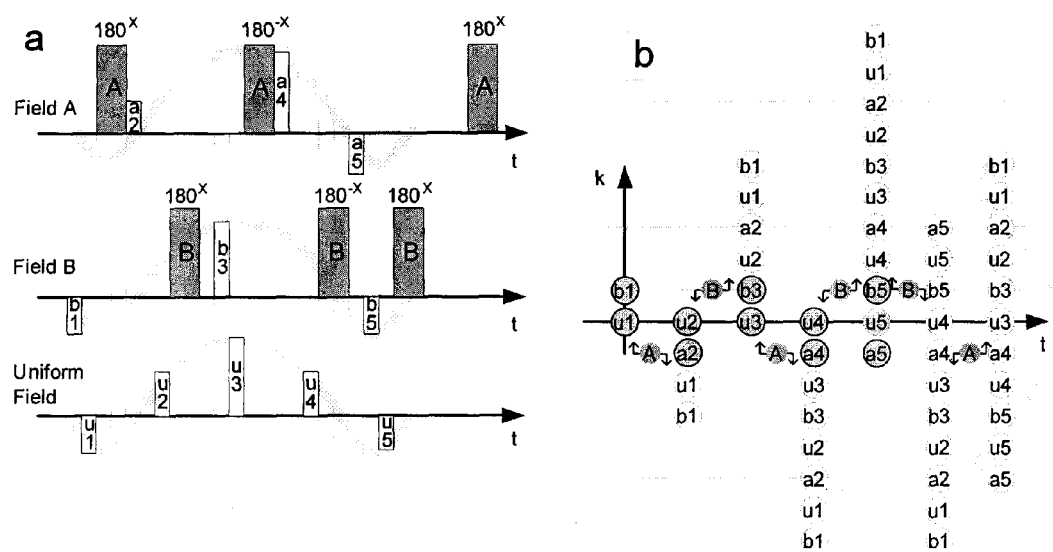
FIGS. 6*a,b* schematically illustrate a 1D excitation pulse train with 3 B1 fields and the k-space weighting function produced using the excitation pulse train.

FIG. 6a schematically illustrates an improved pulse train using the apparatus of FIG. 5a. As will be evident to those of skill in the art, the example is artificially brief having only 6 refocusing pulses: 2 pairs during a spreading phase and 1 pair in the recentering phase. As the $B1_a$ and $B1_b$ fields have different k-space foci than the uniform RF B1 field, in each interval between refocusing pulses small flip angle pulses of the B and $B1_b$ fields are aligned with different parts of the k-space weighting function than the uniform RF B1 field. This increases a definition of the k-space weighting function, and therefore reduces aliasing effects, and advantageously does so without significantly extending the duration of the excitation train, as the small flip angle pulses are much shorter in duration than the refocusing pulses.

As the refocusing pulses are generated by the $B1_a$ and $B1_b$ fields, the k-space weighting function flips over the k-space foci A and B, and accordingly the same part of the k-space weighting function is presented to the A/B before and after refocusing with $B1_a/B1_b$. Accordingly, in only one or the other of the intervals before and after refocusing with one of the fields can a small flip angle pulse of that same field be uniquely applied. For this reason small flip angle pulses using $B1_a$ and $B1_b$ fields only follow the refocusing pulses using the same. The uniform fields can be used to deposit energy in each interval with no redundancy.

This pulse train can be expressed as: [Low-Flip-Angle-$B1_b$—Low-Flip-Angle-U—Refocusing Pulse A—Low-Flip-Angle $B1_b$—Low-Flip-Angle U—Refocusing Pulse $B1_b$—etc.].

The increase in the density of the points of energy deposition in the k-space weighting function using this excitation train in comparison with that of FIG. 5a is apparent from FIG. 6b. During the spreading phase (first 4 steps) the earlier deposited small flip angle pulses are spread monotonically outwards with the alternating flipping over A and B. During a subsequent phase the k-space weighting function is recentered by refocusing pulses that retract the motion. It will be noted that double the number deposited energy points on the k-space trace is provided using this example in comparison with the example of FIG. 5a.

It will be appreciated that the order of the small flip angle pulses within any interval has no bearing on the k-space weighting function. There is a slight preference for depositing the energy with the fewest number of refocusing pulses in between the readout and the deposited energy as the refocusing pulses have errors associated with them. Accordingly some optimized solutions, as shown in FIG. 6a, will include energy deposited before a first refocusing pulse to only all points on the k-space weighting function that will not be, in a subsequent interval, presented to a k-space focus of one of the B1 fields. However, it will be appreciated that this optimization is only based on the ideal definition of the k-space weighting function without regard to imperfections of the B1 fields, and experimental considerations that may lead to other sequences being preferable in respective embodiments.

Although these embodiments have utilized energy deposition by delivering more than one small flip angle pulse between refocusing pulses, in a sequential (time series) fashion to allow a single transmitter system to be utilized and achieve some degree of acceleration of the excitation process, it should also be noted that a system comprising a multi-transmitter could also be used to deliver small flip angle pulses to many individual localized transmit array elements in parallel to accelerate the excitation deposition by optimized weighting functions for each array element. In a manner similar to transmit SENSE but using TRASE k-space traversal in instead of conventional gradient k-space traversal.

Figure 7:
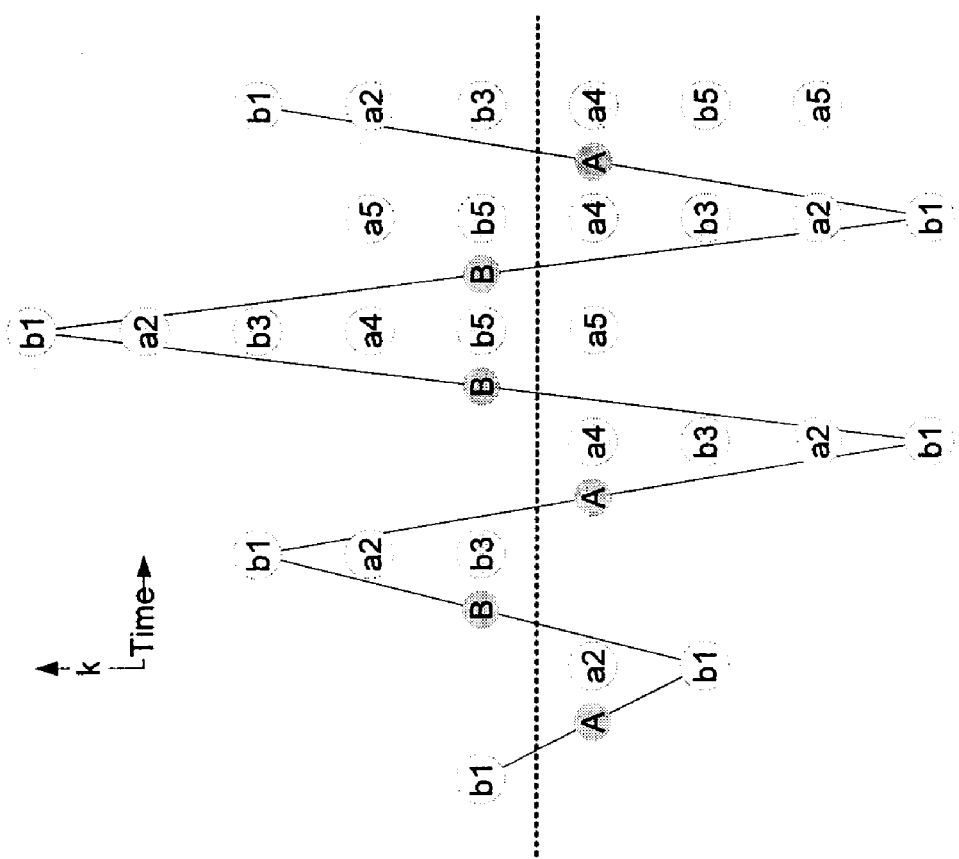
FIG. 7 schematically illustrates a k-space weighting function produced using a 1D excitation pulse train with 2 B1 fields.

FIG. 7 is a schematic illustration of iterative steps in producing a k-space weighting function using only $B1_a$ and $B1_b$ coils having +/−g phase gradients. It will be noted that it is exactly the same as the k-space weighting function of FIG. 6b absent the null gradient u fields. Only half the number of points of energy deposition are provided in the k-space weighting function for the same number of refocusing pulses.

While it will be appreciated that the foregoing examples all provide either two B1 fields or three B1 fields, in each case the k-space foci of the B1 fields are collinear and the line passing through the k-space foci also pass through the origin of k-space. It is natural that once a phase gradient of uniform amplitude and constant phase gradient is identified, that it would be used along with its twin (an oppositely directed phase gradient) to permit the highest phase gradient step, this is not essential. When only the two linear phase gradient B1 fields are used, each refocusing step moves the k-space weighting function out one step or in one step. When the uniform amplitude field is used as well, at each point there are three options: flip the k-space weighting function about the origin, or about the positive or negative k-space foci. As each of these takes the k-space weighting function to an integer multiple of length A (the distance from the origin to the k-space focus of $B1_a$) although you can switch the fields used to advance, there is no way to improve a FOV by moving the k-space weighting function to present points intermediate the A length steps.

Figure 8:
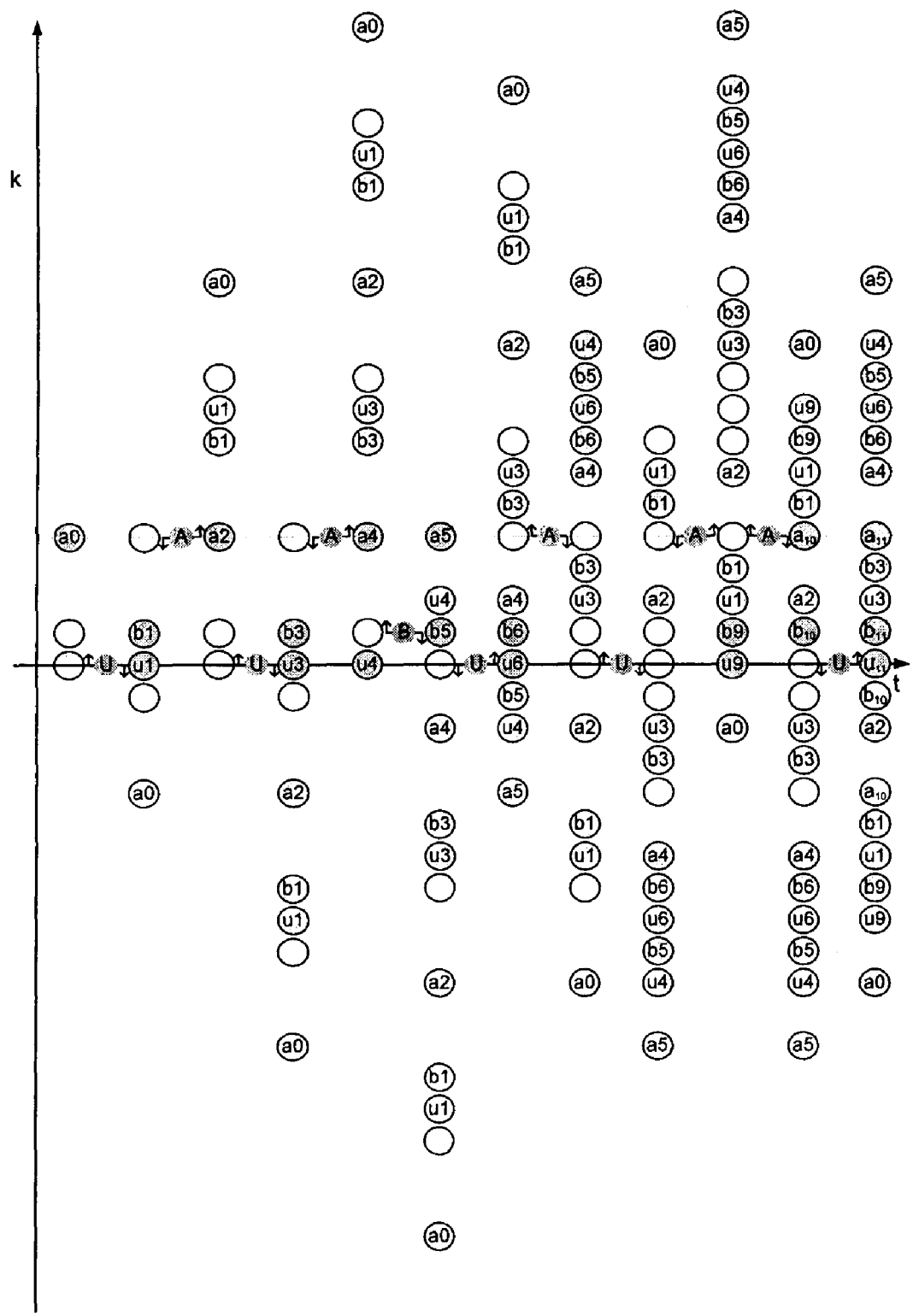
FIG. 8 schematically illustrates a k-space weighting function produced using a 1D excitation pulse train with 3 B1 fields having collinear, non-uniformly separated k-space foci.

FIG. 8 is a schematic illustration of how three coils can be used to produce a desired density of points within a k-space weighting function. For example, a uniform gradient coil, a coil with ½ pi twist and one with a 2 pi twist can be used to provide k-space foci of lengths 0, ½ and 2, respectively. It will be noted that three different lengths of k-space steps can be provided by different combinations of these three B1 fields, whereas only two different lengths of k-space steps can be provided using the uniform and +/−g gradient fields.

In the example, during the first pairs of steps a maximal step size is used by alternating between the strongest phase gradient coil and the null gradient constant phase coil. These allow for the relatively rapid spreading during an initial part of the spreading phase, but provides a pattern within the k-space weighting function that has noticeable gaps. Once a desired resolution is obtained by extending as far out in k-space as needed, the use of one or more smaller step sizes can permit the filling in of one or more of these gaps. As shown, before the maximal extent of the k-space weighting function is deposited, a smaller step size (second largest) is reverted to. This permits a denser deposition without retracing steps. It is noted that alternating A and B rather than A and U provides a smaller step size and smaller gaps within the steps. Given the nature of the spacings between A and B and U, there are no redundant points encountered when alternating between A and B. Alternating B and U will provide the smallest step size and will also present new points of the k-space weighting function to each k-space foci. Switching between these three step sizes and directions (+/−) does not guarantee that no revisiting of k-space points is provided.

In some embodiments the k-space weighting function may consist of numerous passes from the origin to the maximal spreading of points in k-space followed by, for example, a small step and a sequence of the larger steps to allow the completion of the gaps produced by all of the first pass. Depending on the spacing between the k-space foci of the coils, this may repeat, each time adding a different and interleaved set of k-space points.

In the illustrated embodiment it will be noted that an artificially small number of pulses were used, and that the recentering did not leave the k-space weighting function centered on the origin of k-space; but rather on the k-space focus of the B1 field of smaller linear phase gradient. If detection were to be performed with this gradient, this would be preferred.

It is further noted that despite the retraced step there remain 4 gaps in this k-space weighting function. They are symmetrically disposed about the center of the k-space weighting function, which is advantageous as the definition of the excited spatial area will be substantially uniform. Furthermore, with the selection of the number of lobes of the sinc function, for example, these points may be chosen to be points in k-space where substantially no deposition of energy is desired. This is thus an example where non-monotonic stepping is performed during the spreading phase.

It will be appreciated by those of skill in the art the selection of a base unit of spacing between B1 field k-space foci (a unit of 4 is chosen in this example) ensures that recentering of the k-space weighting function can be much more efficient but leaves the same problem of depositing energy on points intermediate the unit steps. Changing the ratio of A to B lengths different units could be defined as desired.

Figure 9E:
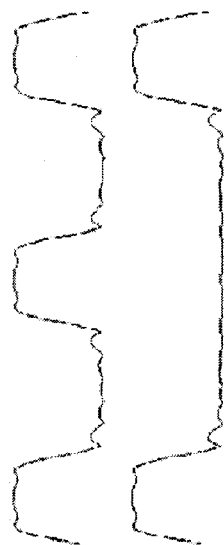
FIG. 9*e* is a simulated image output showing improved aliasing of k-space traces having more distinct points of energy deposition.
Figure 9D:
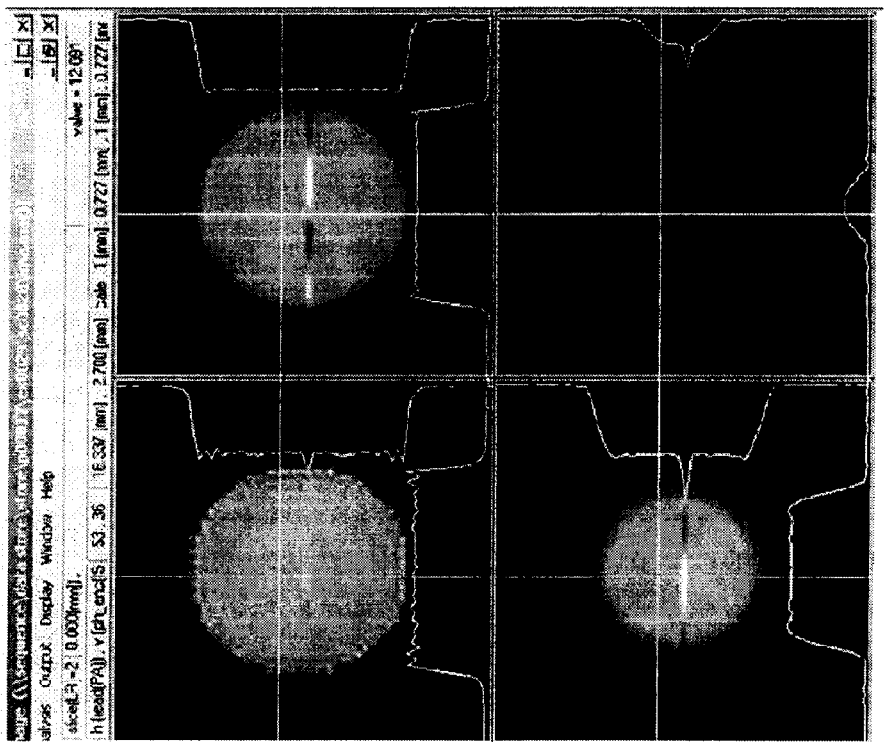
FIGS. 9*a,b* are measurements of slice selection showing slice width selection and spatial offset by modulating a 3 lobe sinc function.
FIG. 9*c,d* are image output of simulated multi-slice experiments showing multi-slice interleaved acquisition in 1D simulated acquisition and 2D simulated acquisition using convention gradient fields.

FIGS. 9a-b are output from experiments; and FIGS. 9c-e are outputs of simulations demonstrating slice selection in accordance with embodiments of the invention.

Figure 3:
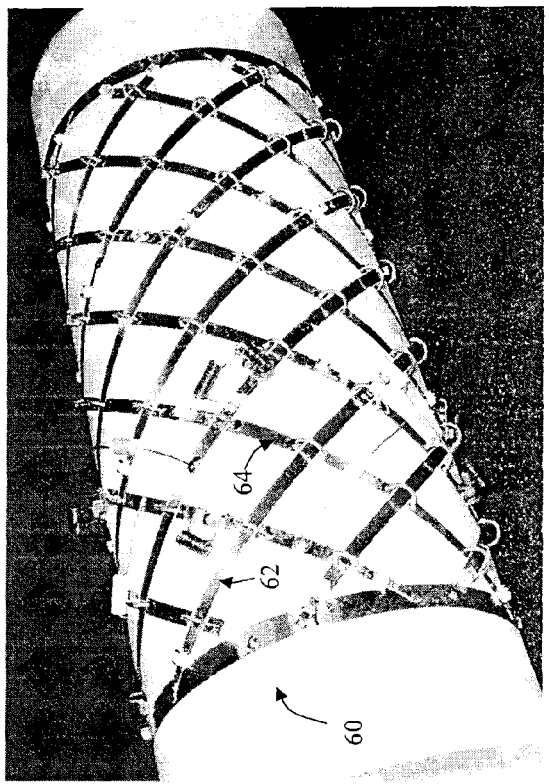
FIG. 3 is an image of a spiral birdcage RF transmitter array adapted to generate a phase-distributed B1 field.
Figure 3:
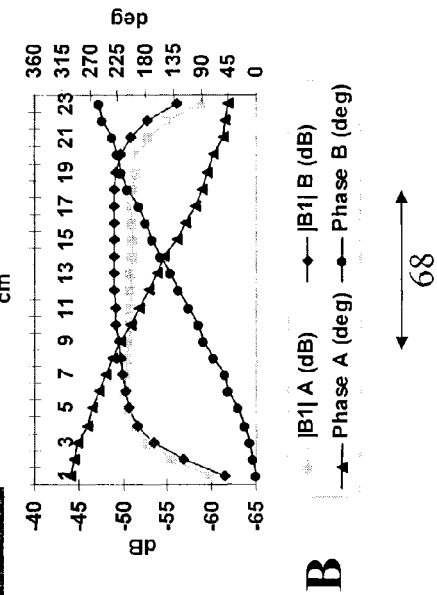

FIG. 9a is the output of three experiments performed on a 0.2 T static magnet using a spiral birdcage coil as shown in FIG. 3 that show how the slice width can be modulated by increasing the number of steps in k-space. Three slice profiles were experimentally measured, using excitation pulse trains with only the $B1_b$ field (coil B) used for small flip angle excitation. The pulse sequences is essentially that shown in FIG. 6a with all a and u small flip angle pulses removed from the k-space weighting function. Excitation train lengths of 32, 40, and 50, refocusing pulses corresponded respectively to slice widths of 16 mm, 12.5 mm, and 10 mm. In each case the readout was performed using conventional gradient fields.

The 0.2 T system was manufactured in-house, and consisted of a standard configuration $M_{R1}$ system, with console, gradient system and RF system. The RF system was enhanced to allow switching between different RF coil transmit fields by using PIN diode switching, under pulse sequence control.

The system used a TMX console (NRC, Winnipeg, Manitoba, Canada) operating at 8.2 MHz was installed on a low field animal research system. The console is interfaced with a permanent 0.2 Tesla, 45 cm free gap, 4-poster magnet (AMAG, Poland), 3-axis linear gradient amplifiers (Techron, USA), and a low frequency RF amplifier (Tomco Technologies, AU).

The console hardware includes: frequency references, waveform generation, multi-channel digital data acquisition, analog RF receiver front-end and transmitter chain, hardware interfaces and built-in test facilities. In use, this hardware is interfaced to peripherals assemblies, including power amplifiers and the shim PSU.

Miscellaneous slow control functions, including gain settings, shimming control, eddy current pre-emphasis configuration, loopback control and gating configuration are performed by an independent control system ('Asynchronous System'). The server communicates with the GUI PC via a TCP/IP connection.

The console sequencer software executes on a high performance x86 PXI computer (National Instruments, Austin, Tex.) running a real-time operating system (RTOS) and generates synchronous waveform and digital control data over the PCI bus. A PCI DAC card produces five channels of 16-bit analog waveform output at 100 k samples per second (RF transmit I & Q envelopes, Gx, Gy, Gz), while a high speed digital output card (NI PXI-6534) generates frequency and other control signals.

The pulse sequencer is modified to control digital TTL output lines which are used to control diode current drivers and which activate PIN diode switches. The PIN diodes are part of the coil array assembly. The PIN diodes are switched to select the coil or coil elements needed to produce the desired phase gradient.

FIG. 9b is the output of three experiments performed on the apparatus described in relation to FIG. 9a that show how the slice location can be modulated (using the second slice shift method) in relation to FIG. 5f. In the first image, −/+7.5 degree phase shifts for A&B coils corresponding to a −6 mm cm shift with respect to the center slice of the sample volume was excited. The second output had a +/−1.56 degree shifts for coils A and B respectively, corresponding to a +1.25 mm shift in the slice. The third output had a +/−9.4 degree phase shifts for coils A&B corresponding to a +7.5 mm shift in the slice. The three experimental slice profiles obtained using otherwise the same pulse trains used in FIG. 9a.

FIG. 9c is output of a simulation of multi-slice imaging showing interleaved encoding and acquisition of 5 slices. The slice selection is performed using a simulation of the TRASE setup with a uniform phase gradient RF coil for excitation and used an excitation pulse train similar to that shown in FIG. 5. The detection of the slice was simulated using conventional gradient imaging as previously described. The pulse train consisted of 50 pulses during the spreading phase and 25 for recentering and used 180 degree flip angle pulses. Accordingly there were 50 small flip angle pulses used to produce the excitation in each shot.

Interleaved multi-slicing was performed so that while spins outside the selected slice are returned to the equilibrium +z axis, other slices were selected and measured. Therefore while 0.8 s are required for relaxation time between selecting a slice and reselecting it, during this time another slice can be excited and a line of data can be read out for that slice as each slice corresponds to an independent range of frequencies. Each of the 5 slices was excited within a 100 ms interval and immediately read out using conventional gradients in about 10 ms. 160 ms after a given excitation pulse sequence began, the subsequent excitation pulse sequence for a different slice begins and thus 5 slices are imaged within the 800 ms relaxation time. It will be noted that the slices are of lower amplitudes for later acquired slices because of relaxation effects.

FIG. 9d is simulation output computed with a simulated conventional gradient based detection module for a slice selected using a method in accordance with the invention. Four different slices were simulated of a virtual ellipsoidal phantom. The ellipsoid centered on the origin has extremes in the x axis at + and −60 mm, and in the y and z axes at + and −15 mm. The phantom was oriented so that the encoding direction was the x axis. The largest imaged slice (top left panel) corresponds to a slice through x=−1.5 mm (top left). The 3 other slices selected are at x=19.5 mm (top right), x=40.5 mm (bottom left), and x=61.5 mm (bottom right). Each slice has a thickness of 14.4 mm.

The excitation pulse train used to select the slice again contained 50 (180 degree) refocusing pulses ($B1_a$ and $B1_b$) in which 50 uniform B1 field small flip angle pulses were produced in the spreading phase and 25 steps were performed to return the k-space weighting function to center. The amplitudes and phases of the 50 small flip angle pulses were modulated to produce a 3 lobe sinc profile.

As with the case of the multi-slice imaging example, each slice is selected and a line of the image is in one quarter of the 800 ms relaxation time, and in the other three quarters of the relaxation time the same line in the other 3 slices is acquired.

The additional phase shifts to produce these different slices were calculated according to $r_0=(\phi_A-\phi_B)/2\pi(k_{1B}-k_{1A})$, where r0 is the slice position.

The profiles of the 4 images are shown in the y and z directions. There is an artifact in the y direction causing a sharp band through the equator of the images. As expected the diameter of the excited region within the phantom is shown in the imaging, and the diameter varies with the offset of the slice. The images (except where the slice is substantially out of the phantom) show a uniform intensity.

FIG. 9e shows the improvement in aliasing provided by doubling the number of points that define the k-space weighting function. The bottom panel shows images taken from a pulse sequence similar to that of FIG. 7 (20 refocusing pulses), whereas the top panel shows images with the same refocusing pulse train as the bottom panel, but having only the deposition of the small flip angle pulses with the $B1_a$ field. The image produced with the simulation of slice selection using only $B1_a$ field small flip angle pulses (upper image), is compared with that produced using alternating small flip excitations from both A & B coils (lower image) shows the improvement in aliasing. The doubling of the number of points on the k-space weighting function improves the FOV (aliasing period) relative to excitation with the A coil only. Addition of a third (e.g. uniform) coil results in a further doubling of the k-space sampling density.

Oblique Slice Selection

Figure 10:
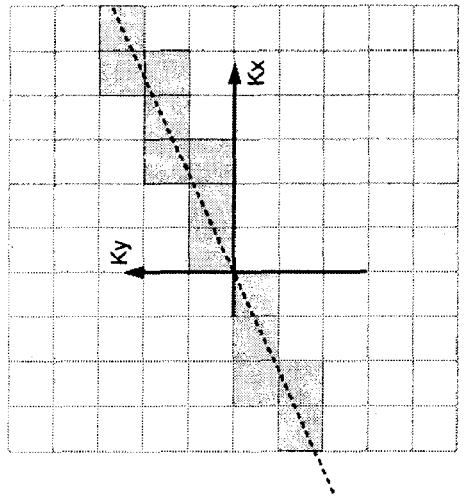
FIG. 10 schematically illustrates on-axis traversals of 1D k-space which the preceding excitation pulse trains followed, in comparison with an oblique k-space line required to excite a slice at an oblique angle between the kx and ky directions.
Figure 10:
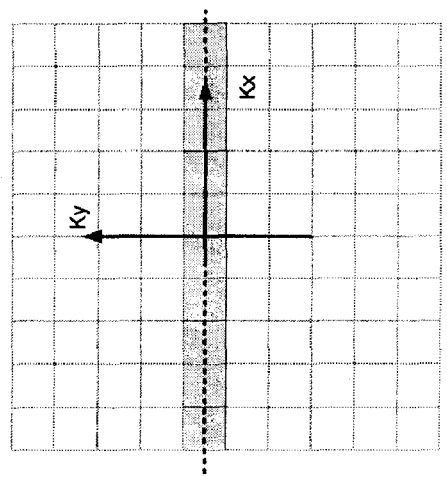

The foregoing examples all performed slice selection using a single encoding (linear) direction and thus produced a selection of a slice through the sample volume that is orthogonal to the encoding direction. In some cases it may be desirable to produce a slice having an orientation at an angle between two or more encoding directions. FIG. 10 illustrates such a line in k-space.

Figure 11:
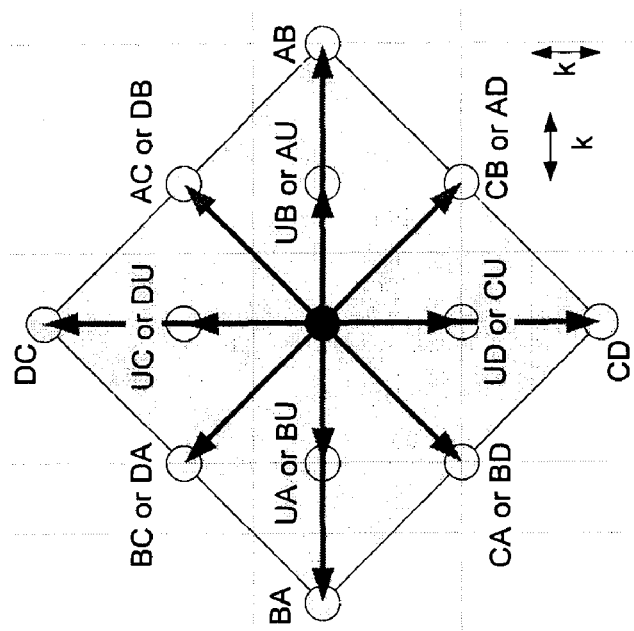
FIG. 11 is a schematic legend illustrating k-space foci of 5 coils showing how pairs of steps in k-space affect any point of energy deposited on a k-space weighting function.
Figure 11:
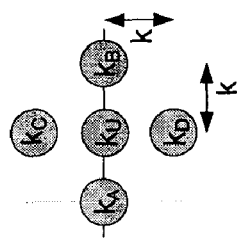

FIG. 11 shows a legend of how a k-space weighting function is affected by pairs of refocusing pulses. The effect of a pair of refocusing pulses is to translate the entire k-space excitation pattern (that is present before the refocusing pulses) by the vector shown. This shows that it is possible to move the excitation in any direction in k-space. While this legend shows the effect of these 5 B1 fields, it will be appreciated that other fields could be used and that similar legends can be computed analogously.

Figure 12A:
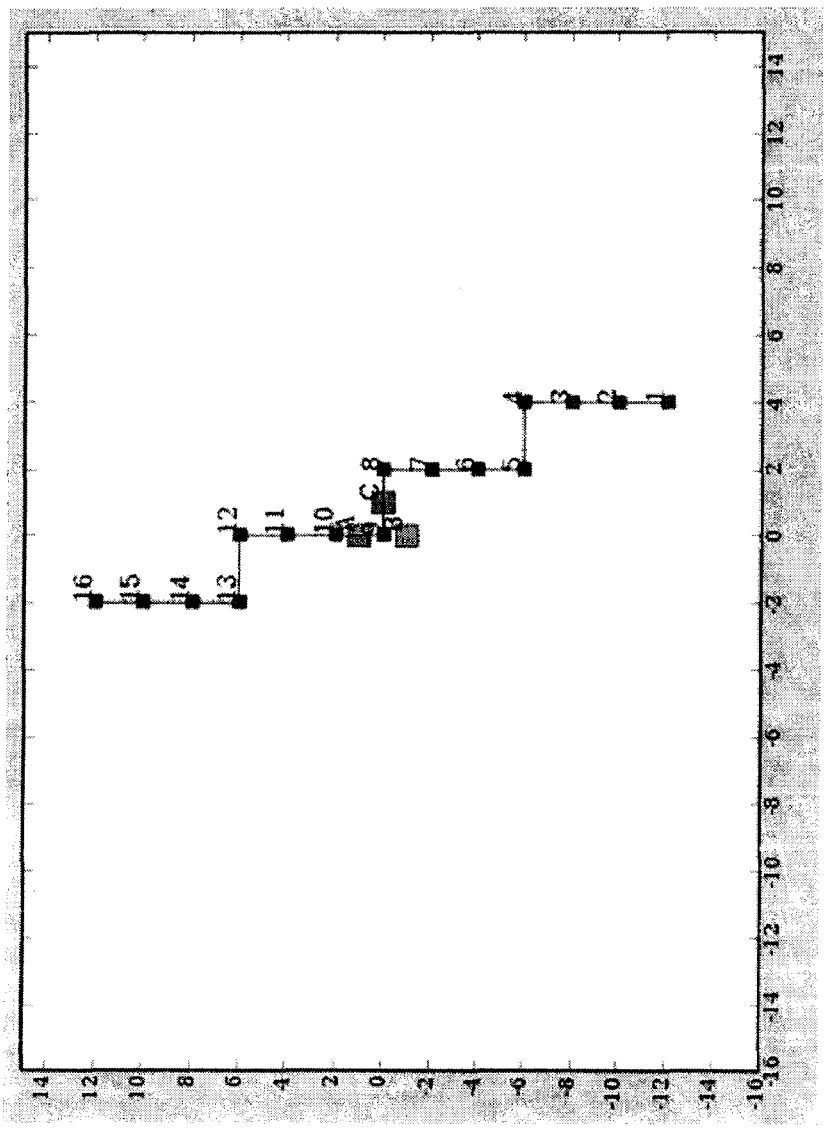
FIGS. 12*a,b,c* are three exemplary k-space weighting functions produced in 2D along oblique lines.
Figure 12B:
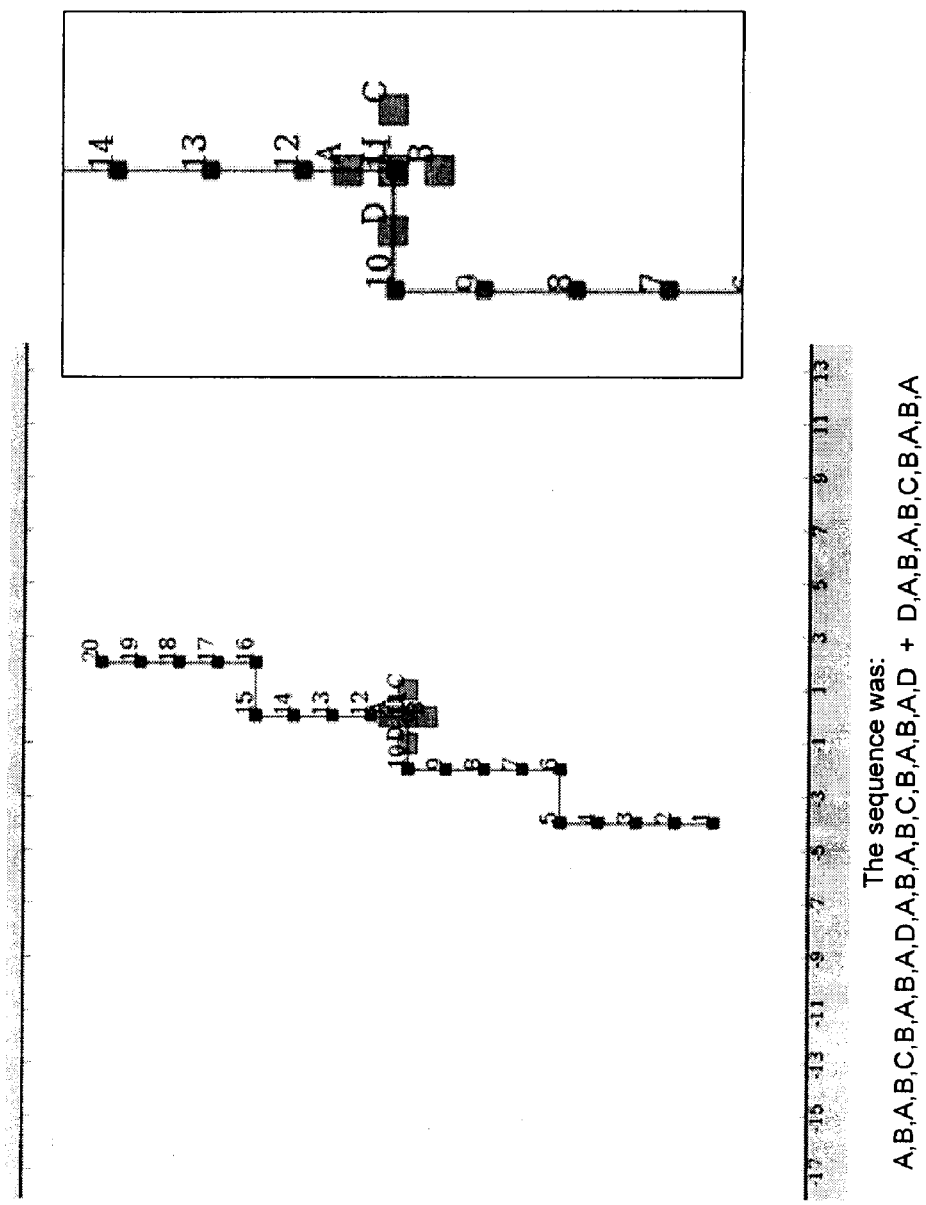
FIG. 12*d* is a schematic illustration of how selecting different small flip angle pulses presented using the refocusing steps of FIGS. 12*b,c* permit deposition of energy on a range of different lines.
Figure 12C:
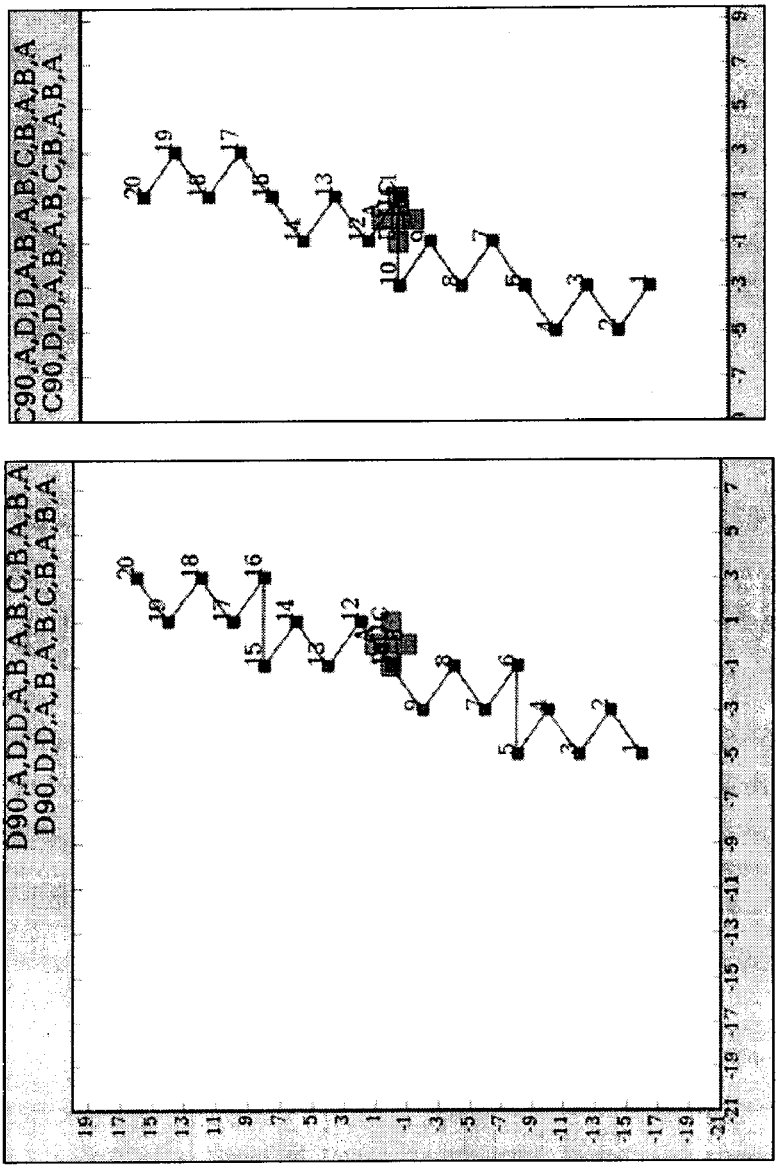

FIGS. 12a-c schematically illustrate the order of deposition of energy in the k-space weighting function for producing an oblique slice.

FIG. 12a is a k-space weighting functions for an oblique line having a slope of −4. The sequence of refocusing pulses is: (A,B,A,C)×4,(C,A,B,A)×2. The minimum number of fields (3) are used in this example. Before every pulse in the forward part a U pulse (uniform field) small flip angle pulse is used. The recentering phase in this case is the $2^{nd}$ half the forward part, but reversed in order. No small flip angles pulses are used during the recentering phase (in this example).

FIG. 12a shows the k-space weighting function if only the U field is used to produce small flip angle pulses, and one is included in each step. This produces a somewhat jagged line of points of deposited energy. It will be appreciated that by selecting more than one point according to the proximity to the desired line, and weighting the points accordingly, a modified sinc function could be computed to produce excitation that may be more similar to that of a slice.

FIG. 12b is a k-space weighting functions for an oblique line having a slope of 5. The sequence of refocusing pulses is: ((A,B)2,C,(B,A)2,D)2,D,(A,B)2,C,(B,A)2. This example uses 5 fields, and shows only the excitation of the uniform phase field.

FIG. 12c shows two k-space weighting functions that could be used for a range of oblique lines, as the paths essentially define bands within the k-space. Again 5 fields are used in both these examples. The following sequence of refocusing pulses: ((A,B)2,C,(B,A)2,D)2,D,(A,B)2,C,(B,A)2 is used in both examples. On the left hand side panel the k-space weighting function forms a band that is defined with only small flip angle pulses emitted with the D B1 field. The right hand panel uses only the small flip angle pulses emitted with the C B1 field.

Figure 12D:
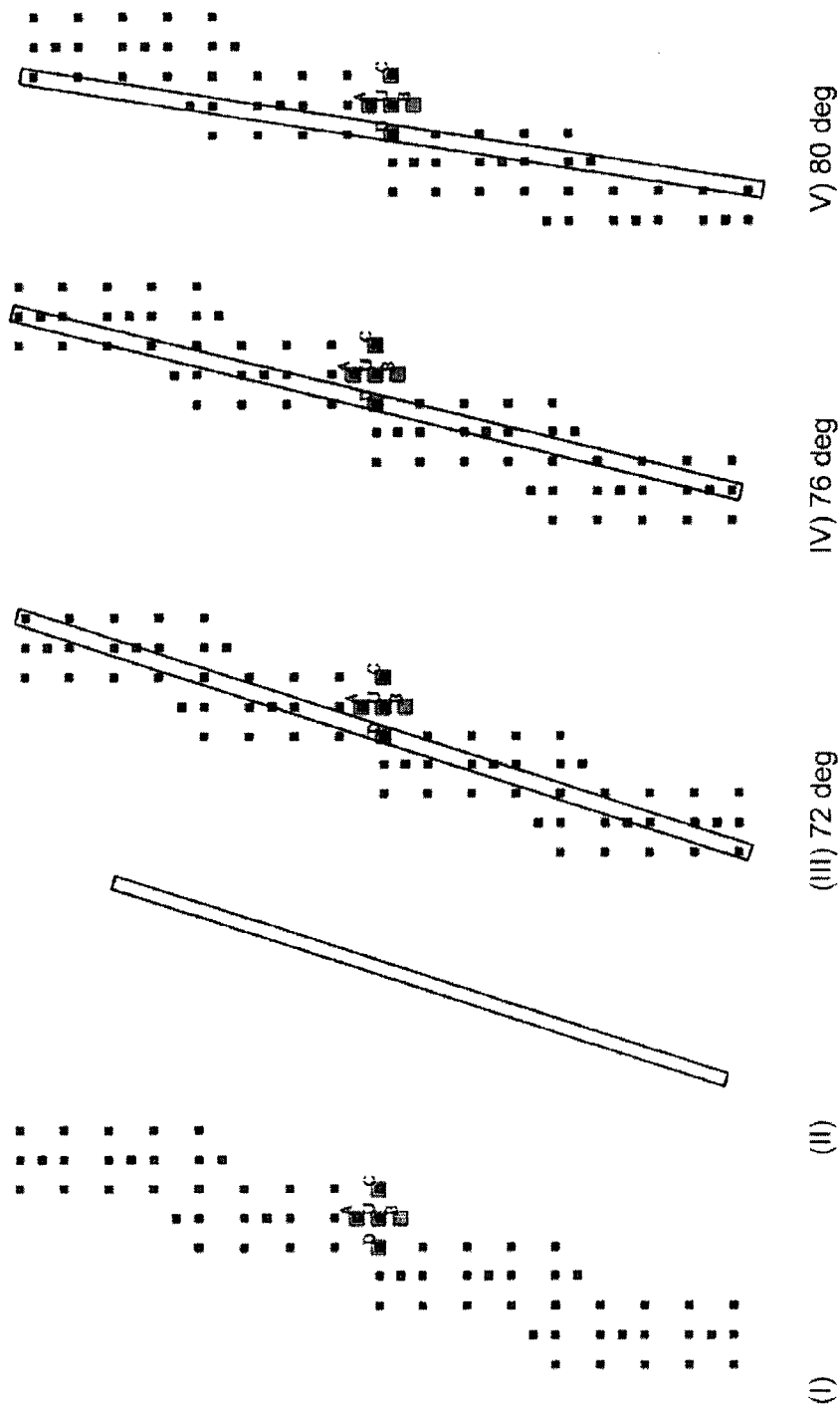

Given the band that is defined by the refocusing pulses listed in this sequence, it will be noted that selection of the particular small flip angle pulses from respective B1 fields at the given steps can be used to deposit energy along different lines of different angles. FIG. 12d schematically illustrates this capability.

The left hand image (I) shows all of the points available for deposition of energy in the 2D k-space weighting function following the refocusing sequence described in FIGS. 12b,c. Thus, the full set of accessible k-space points is shown in I. The points are distributed in a region that covers an oblique patch or band in k-space.

The second from left image (II) schematically illustrates a narrower band which can be used to identify a line through the full set of accessible k-space points to pick out a line at a given angular offset from the axes of k-space. The k-space points within the narrower band may be used to identify the points for the specific line used and the weighting of the points in correspondence with the sinc (e.g. 3 lobe) or other envelope. To select an oblique slice, the required k-space weighting function lies along an oblique line in k-space at the same angle. A typical weighting function for a 1D slice is a sinc function.

It will be appreciated by those of skill in the art that the narrower the band used for excitation the fewer the number of points in the k-space trace are available, and consequently the less defined the k-space weighting function will be. In contrast, the wider the line is, the more the slice selection will be non-uniform at the edges of the FOV. It will be evident that averaging of energization deposited at points in proportion to the distance from a central line can be used to trade off between the linearity of the points and the definition of the k-space weighting function, as desired.

Examples III-V show the enhancement of oblique slice selection leveraging the flexibility provided by selection of the 5 B1 fields and their degree of excitation to fine-tune the slice angle. For each of the examples shown in III-V, the coil D is the center of the excitation pattern, so could be used as the receive coil.

In FIG. 12d part (III) a narrower band of angle 72° is shown. An oblique slice of 72° is selecting by choosing the set of points that lie within, on the edge, or outside but close to the box and applying excitation, weighted as necessary to give the desired k-space power distribution.

In FIG. 12d part (IV) a 76° angle slice is selected by using different points from the same distribution (i.e. same refocusing pulse sequence, but a different selection of small flip angle pulses, and different weights).

In FIG. 12d part (V) an 80° slice is selected using again different points from the same distribution.

Examples III-V demonstrate that given the set of points available from this experiment a range of oblique angles can be achieved by choice of the points lying closest to the desired oblique line. For slice angles outside the range 72 . . . 80° the sequence should be modified to provide points lying at a different angle in k-space.

2D Spatial Selection

All the methods described for selection of a 1D slice have analogous 2D and 3D equivalents. For example, the 2D case involves moving through 2D k-space and thus the RF energy deposited into a planar 2D k-space weighting function. This allows the selection of a 2D shape, such as a disk, or a square. The analogous 3D experiment results in selection of a 3D shape, such as a sphere, or a cube. Naturally a line in 3D can be used to define a plane that is oblique to all axes of the Cartesian coordinate space defined by the 3 encoding directions.

Figure 13A:
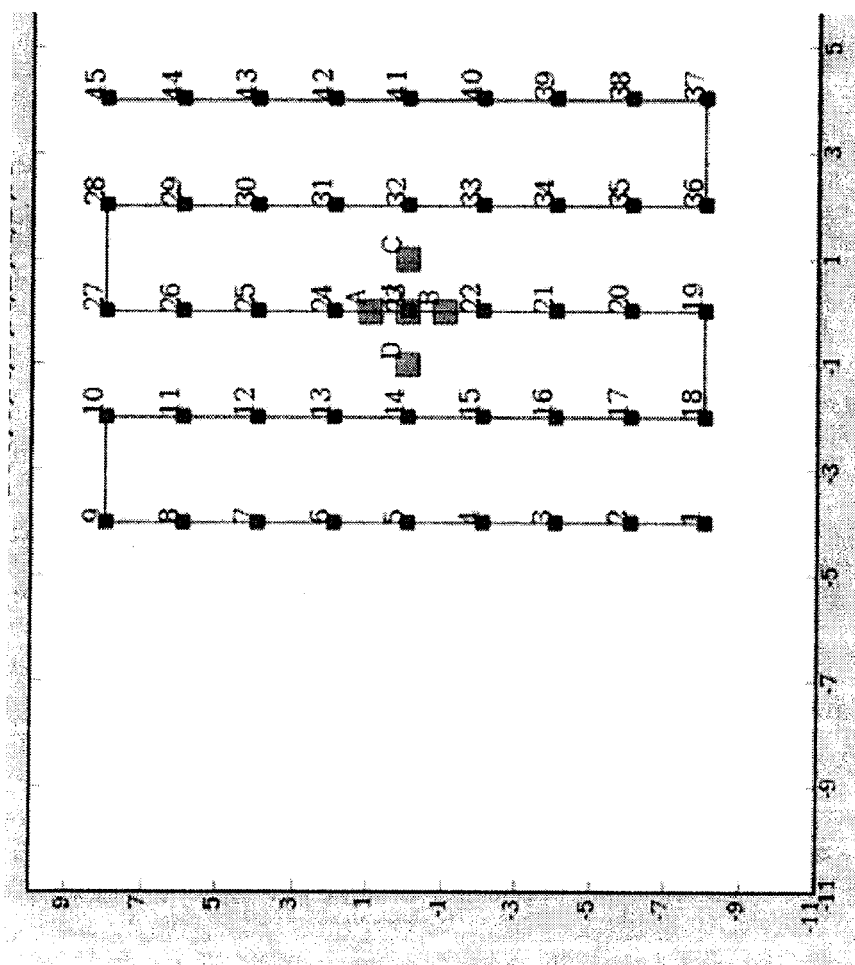
FIGS. 13*a,b* are two exemplary k-space weighting functions produced in 2D to cover a rectangular region, which permits spatial localization of excitation in two dimensions.

FIGS. 13a,b are two examples of k-space walks providing for the deposition of energy to spatially select a disk or a square, or otherwise delineate an area of excitation. It will be appreciated by those of skill in the art that the rotation of the sinc function truncated at a desired point can produce a disk and the product of two sinc functions will select a square. Accordingly the weights given to the small flip angle pulses will determine what limits are provided to the extent of the excitation in the directions corresponding to the encoding directions kx and ky. There are different paths that can be traced to cover a region of 2D k-space and others are equally possible and may be preferred in certain embodiments.

FIG. 13a This is an example of the final k-space coordinates for a 2D selective excitation sequence consisting of: ((A,B)4,C,(A,B)4,D)2,(A,B)4,C during a spreading phase and (A,D)4,A during the recentering phase. Before every refocusing pulse during the spreading phase, a uniform field small flip angle pulse is used. This forms a zig-zag (EPI-type) trajectory.

Figure 13B:
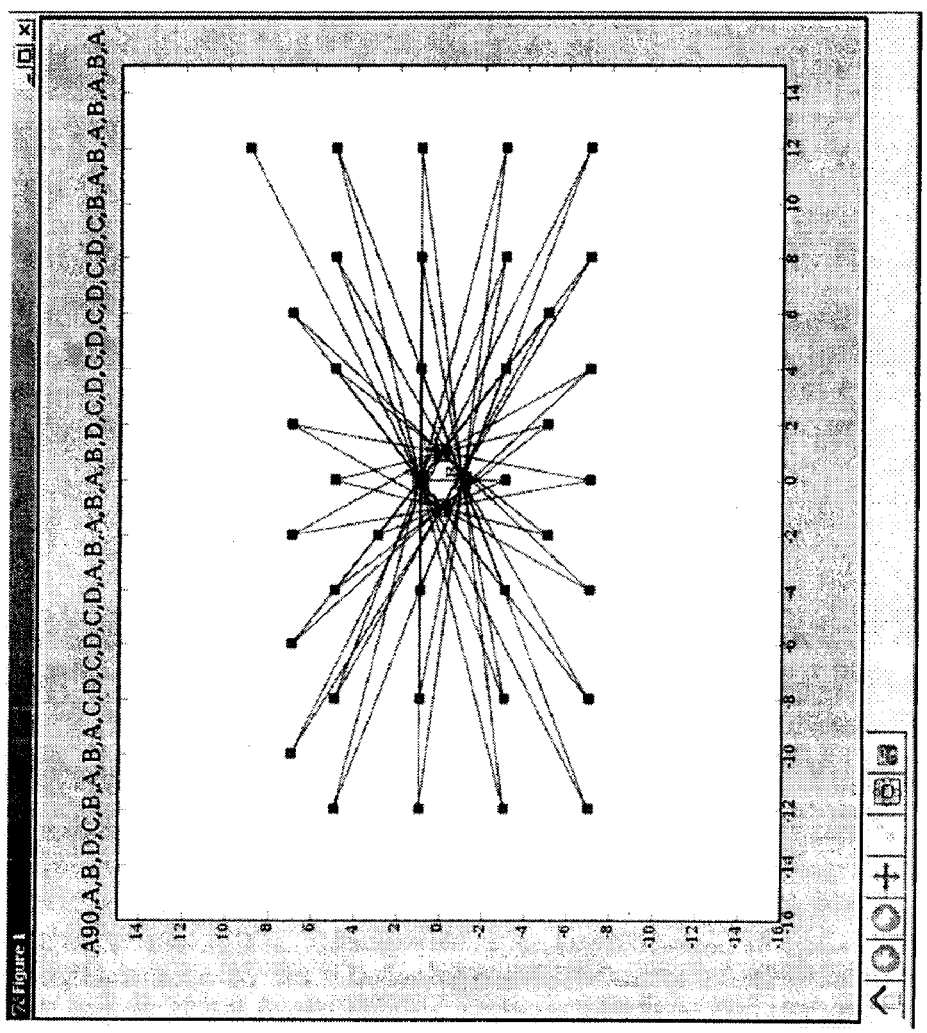

FIG. 13b schematically illustrates an example of a single echo train which maps out a 2D region in k-space. This particular sequence uses 4 coils with k-space foci in the plane. It is a form of square-spiral trajectory. Only the spreading phase is shown. The sequence of refocusing steps is: A,B,D,C,(B,A)2,(C,D)3,(A,B)3,(D,C)5,(B,A)4.

Figure 14:
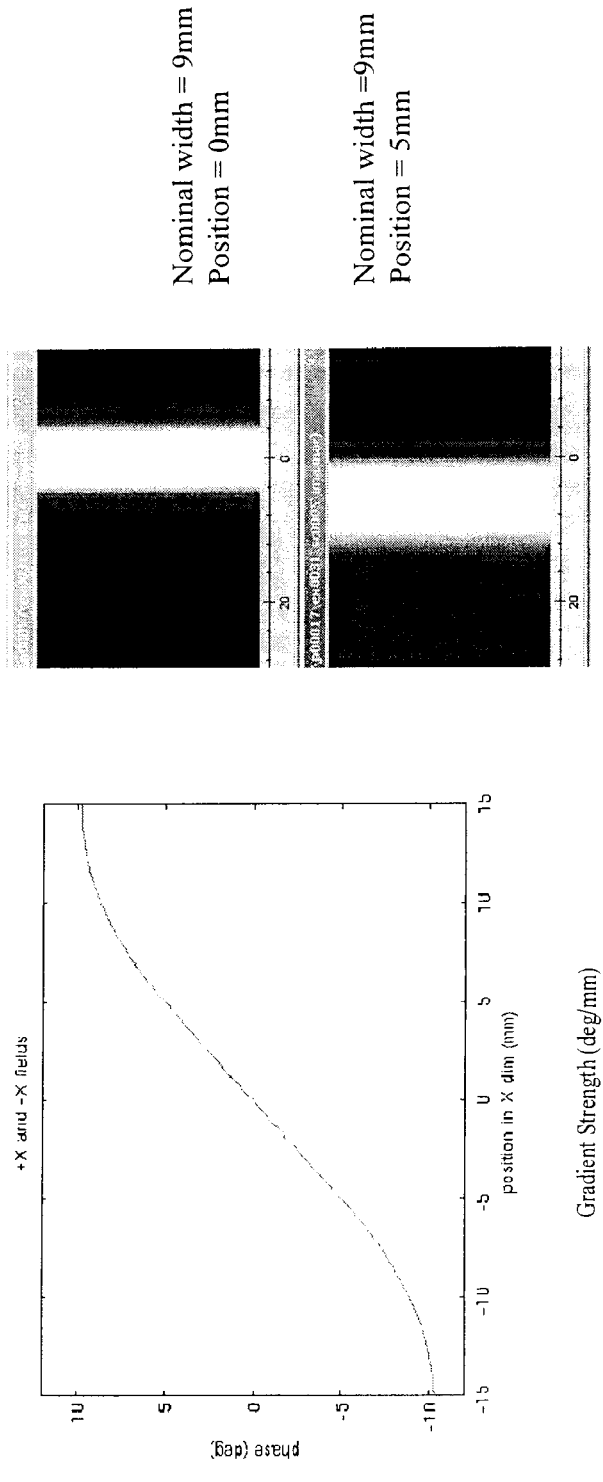
FIG. 14 is a schematic illustration of a simulation demonstrating applicability of B1 fields having non-linear phase distributions throughout the sample volume for producing slice selection and k-space traversals.
Figure 14:
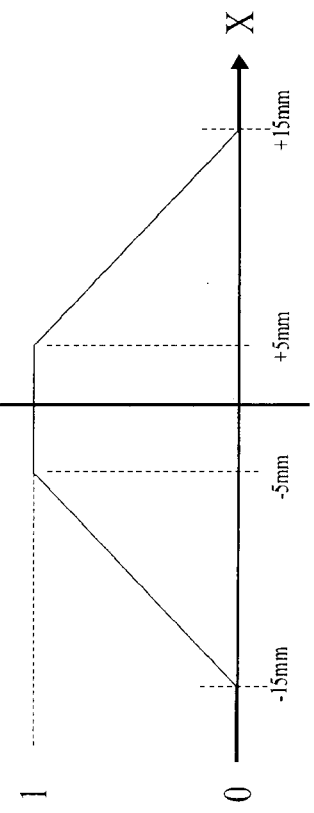

FIG. 14 shows a field having a uniform amplitude and non-linear phase distribution. The top left hand graph shows a two phase distributions of symmetric B1 fields that have substantially linear segments within a middle section and attenuated phase distributions at the ends where it approaches a null phase gradient. This is shown for one of the B1 fields in the lower graph. The second field would look like the same trapezoid reflected about the x axis. When these B1 fields are alternated in a TRASE simulation, the center of the sample volume which is exposed to the linear sections of the phase gradients will operate as if the coils are linear phase gradient coils, but parts of the sample volume where the phase gradients are weaker will not be moved in k-space to the same degree and thus less coherent phase accumulation will occur in these parts. Given the durations it is generally safe to assume that there is little motion of the dipoles between these regions. At each iteration of the refocusing, the same fraction of the sample volume will be exposed to the different effective phase gradient steps and accordingly the difference in k-space position of the segments of the sample volume will diverge increasingly.

The simulation output shown at the right demonstrates that near a center of the sample volume the selected slice bears an intensity and definition consistent with other examples, and that the lower image of a slice selected at a position substantially at the edge of the linear part of the phase distribution already shows a marked blurring caused by the differentiated effect of small flip angle pulses using these fields.

Figure 15:
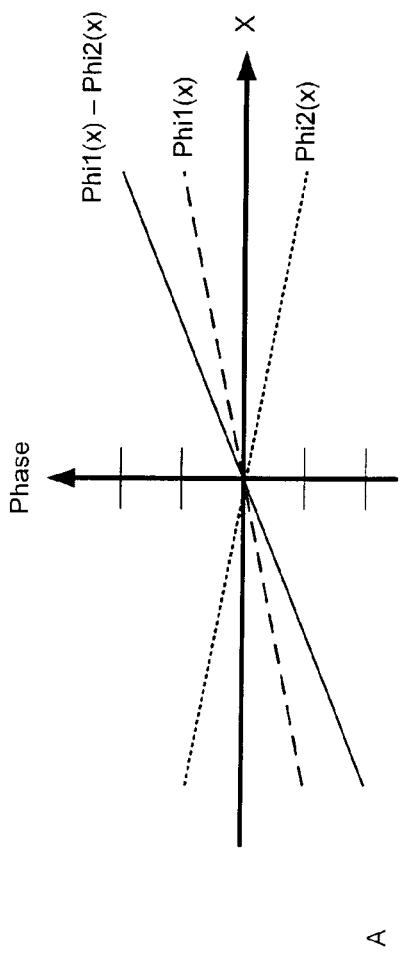
FIG. 15 is a schematic diagram showing how a linear phase difference between 2 fields along 1 axis can be produced without the individual fields having linear phase distributions.
Figure 15:
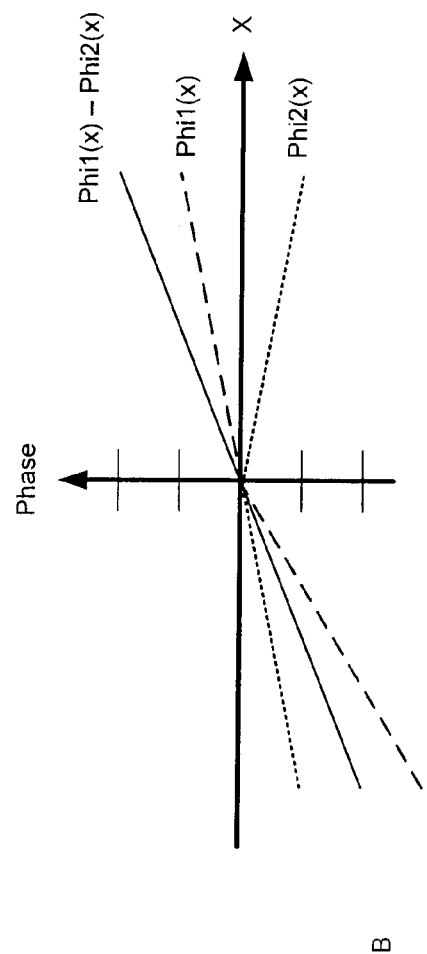

FIG. 15 shows a complementary phase distribution that could be used in place of linearly varying phase B1 fields to achieve equivalent results. As the first derivatives of the phase as a function of position of the complementary B1 fields are the same, application of one followed by the other of the complementary B1 fields (within the static field) a uniform k-space step is produced at all points in the sample volume.

An odd number of the applications of these two B1 fields will produce a distributed k-space where all of the points will be bifurcated within the sample volume, In one region of the sample volume, the points will be effectively flipped over the k-space focus associated with the slope of the first line segment and the remainder of the sample volume will be flipped over the k-space focus of the slope of the second line segment. The subsequent application of the other B1 field will see the bifurcated points rejoined. The diagram shows how a linear phase difference between 2 fields along 1 axis can be produced without the individual fields being of uniform phase.

While this is shown with phase distributions having a singular discontinuity, it will be appreciated that 2 or more discontinuities that also match spatially within the sample volume between the two coils are equally contemplated. Furthermore the pairs of smoothly varying phase as a function of distance that have first derivatives that sum to a linear function can equally be used.

Figure 16:
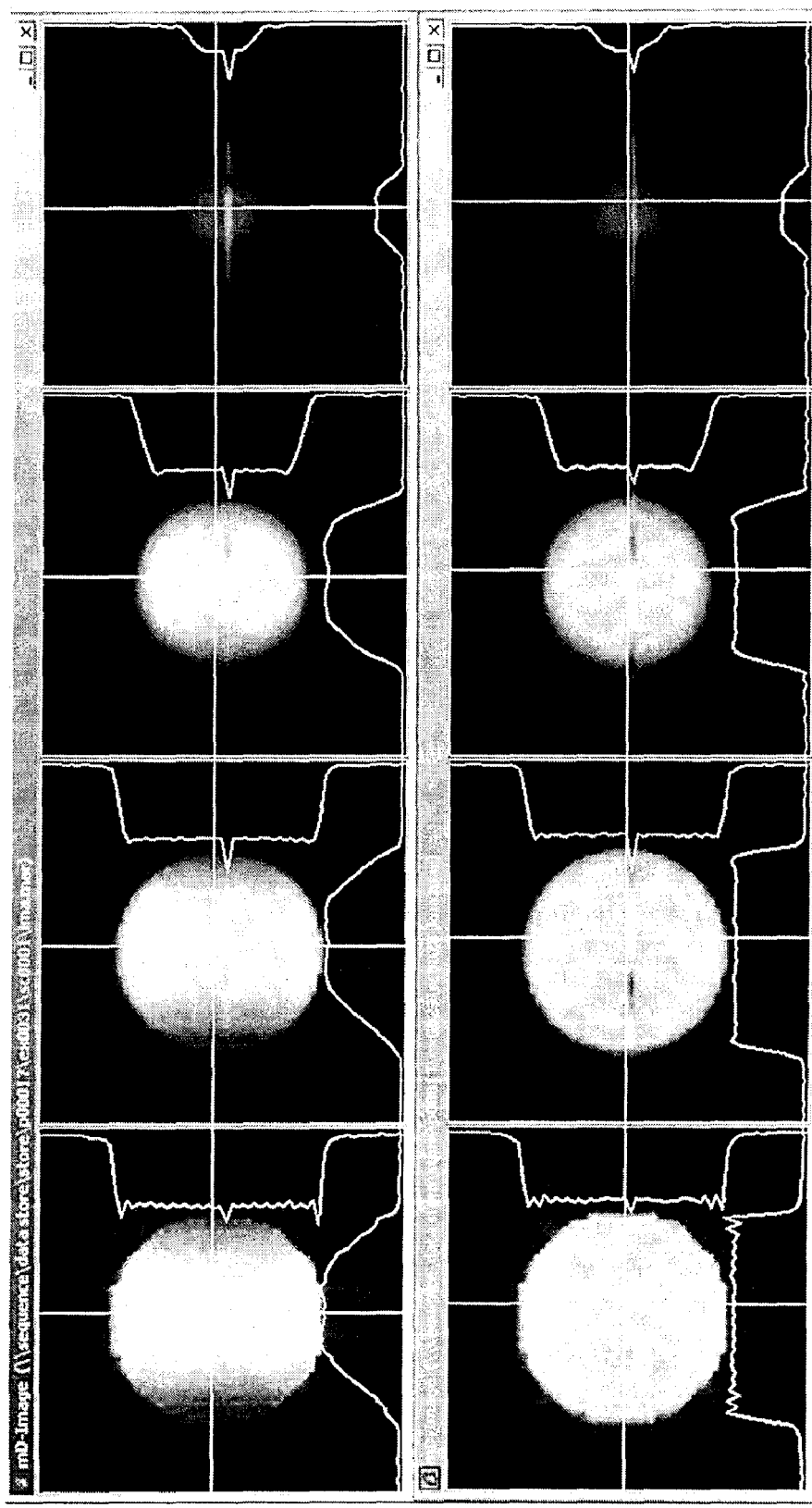
FIG. 16 is a simulation showing that the small flip angle pulses can be applied using a B1 field that is neither a phase gradient nor uniform in amplitude over the sample volume using a multi-slice selection.

FIG. 16 shows two simulated multi-slice image datasets using TRASE slice selection with conventional readout and phase-encoding but using a RF field having a Gaussian amplitude distribution over the sample volume, and a uniform phase distribution for the excitation pulses. For comparison, the lower panel shows a uniform amplitude RF coil used for the excitation. It will be noted that the intensity of the image acquired drops off on the sides of the image where the intensity of the RF field is weaker (x direction). It will be noted that the small flip angle pulses do not have to be of uniform amplitude over the sample volume for slice selection to be effective.

It will be appreciated that this local sensitivity of the excitation field can be used to limit aliasing along any axis. Specifically if the Gaussian distribution were used for excitation in the direction of excitation encoding, regions of the sample that are remote from the selected slice will not be energized. This may conserve energy and reduce the amount of radiation emitted into the sample, and may further reduce aliasing effects.

A method is provided for exciting a series of NMR signals specific to parallel slices in the sample by a series of interleaved slice-selection sequences. This provides analogous operation to multi-slice methods in conventional frequency-selective slice selection.

Other advantages that are inherent to the structure are obvious to one skilled in the art. The embodiments are described herein illustratively and are not meant to limit the scope of the invention as claimed. Variations of the foregoing embodiments will be evident to a person of ordinary skill and are intended by the inventor to be encompassed by the following claims.

The invention claimed is:

1. A magnetic resonance process for selective spatial excitation of a sample volume in a uniform magnetic field, the process comprising:
   controlling an RF coil array adapted to produce a plurality of B1 fields within the sample volume;
   applying a sequence of refocusing pulses with n of the B1 fields, where n is strictly larger than the number of dimensions in which the spatial region is bounded, and each of the n B1 fields has a substantially uniform amplitude, and a respective, different phase gradient, over the sample volume, and accordingly has a respective, different k-space focus, so that each refocusing pulse reflects a k-space weighting function about the k-space focus of the respective B1 field to change the k-space weighting function with respect to n−1 of the k-space foci; and
   applying a sequence of small flip angle pulses with at least one B1 field interspersed between the refocusing pulses, the small flip angle pulses having intensities and durations modulated to distribute the deposition of energy in the k-space weighting function in accordance with a desired selective spatial excitation.

2. The process of claim 1 wherein the n B1 fields include a pair of B1 fields which have a linear difference in phase gradients but the respective phase gradients are not linear.

3. The process of claim 1 wherein the n B1 fields have substantially linear phase gradients across the sample volume, and accordingly the k-space foci are substantially points in k-space.

4. The process of claim 1 wherein applying a sequence of small flip angle pulses with at least one B1 field interspersed between the refocusing pulses, comprises applying the small flip angle pulses using one or more of the n B1 fields.

5. The process of claim 1 wherein applying a sequence of refocusing pulses comprises:
   during a spreading phase of the refocusing sequence, emitting refocusing pulses with the n B1 fields to deposit energy on, and monotonically move the k-space weighting function away from the origin of k-space; and
   during a recentering phase of the refocusing sequence subsequent to the spreading phase, emitting refocusing pulses with the n B1 fields to monotonically move the k-space weighting function to center the k-space weighting function.

6. The process of claim 5 wherein during each interval between two successive refocusing pulses, at most one small flip angle pulse is emitted with each of the n B1 fields except that in the interval immediately before and after a given B1 field is used to emit a refocusing pulse, the given B1 field is only used to produce one small flip angle pulse.

7. The process of claim 6 wherein during each interval between two successive refocusing pulses, one small flip angle pulse is emitted with each of the n B1 fields except that a single small flip angle pulse is emitted with a one of the n B1 fields in only one of the interval before and the interval after a refocusing pulse emitted with the one of the n B1 fields.

8. The process of claim 6 wherein the n B1 fields include, for each dimension of imaging, a respective set of least two B1 fields that have substantially linear phase gradients in an encoding direction within the sample volume associated with the dimension.

9. The process of claim 8 wherein the origin of k-space, and the k-space foci of any one of the respective sets of at least two B1 fields are collinear.

10. The process of claim 9 wherein a uniform B1 field having a phase that is substantially constant is a member of each of the sets of at least two B1 fields.

11. The process of claim 9 wherein each set of at least two B1 fields includes a pair of B1 fields having g°/mm and −g°/mm phase gradients in the encoding direction, respectively.

12. The process of claim 9 wherein the encoding directions are orthogonal.

13. The process of claim 9 wherein each of the encoding directions are on respective lines in the sample volume.

14. The process of claim 13 wherein:
   the spatial selection is in a region bounded by parallel planes orthogonal to the encoding direction of one of the sets of at least two B1 fields that includes two with maximally separated k-space foci;
   during the spreading phase, 2m repetitions of refocusing pulses with the two B1 fields are emitted in alternation; and
   during the recentering phase m repetitions of refocusing pulses with the two maximally separated B1 fields in are emitted in alternation.

15. The process of claim 14 wherein during the spreading phase, applying a sequence of small flip angle pulses comprises applying the n B1 fields in a repeating pattern of one or more refocusing pulses followed by one or more small flip angle pulses, the pattern having a period of two successive refocusing pulses.

16. The process of claim 8 wherein applying a sequence of small flip angle pulses interspersed between the refocusing pulses comprises applying a fixed number of small flip angle pulses between successive refocusing pulses using a repeating pattern.

17. The process of claim 8 wherein applying a sequence of small flip angle pulses interspersed between the refocusing pulses comprises applying a sequence of refocusing pulses that, at each step present a different part of the k-space weighting function to the at least two B1 fields, except for the B1 field used to apply the last refocusing pulse, during the spreading phase.

18. The process of claim 8 wherein the recentering phase and spreading phase follow different walks through k-space such that new points on the k-space weighting function are presented to one or more of the at least two B1 fields and the recentering phase includes applying small flip angle pulses to deposit energy on the k-space weighting function at these points.

19. The process of claim 1 wherein controlling the RF coil array comprises switching a controlled power supply to a plurality of RF coils so that at most one RF coil can be energized at a time.

20. The process of claim 2 wherein switching comprises rapid programmed switching of the controlled power supply to the plurality of RF coils for generating pulses from the respective RF coils in rapid succession.

21. The process of claim 1 wherein controlling the RF coil array comprises delivering power of selected power and phase to a plurality of array elements so that at most one B1 field is energized at a time.

22. The process of claim 1 further comprising using the at least one of the n B1 fields for subsequent detection after spatially selective excitation by selectively switching of the RF coil array between a receive channel and a controlled power supply.

23. The process of claim 1 further comprising selecting a second spatial excitation in the sample volume in a disjoint region of the sample volume using a second iteration of applying the refocusing and small flip angle pulses to define a second k-space weighting function to effect the second spatial excitation before the spatial excitation relaxes to interleave multiple spatial excitation sequences.

24. The process of claim 1 further comprising selecting a slice along an oblique axis by traversing an oblique trajectory and depositing RF energy to produce an oblique k-space weighting function using refocusing pulses produced with three or more of the n B1 fields having k-space origins lying within a single 2D k-space plane.

* * * * *